(12) United States Patent
Kim et al.

(10) Patent No.: US 9,768,388 B2
(45) Date of Patent: Sep. 19, 2017

(54) AMINE-BASED COMPOUND AND ORGANIC LIGHT-EMITTING DIODE INCLUDING THE SAME

(71) Applicant: SAMSUNG DISPLAY CO., LTD., Yongin, Gyeonggi-Do (KR)

(72) Inventors: Dong-Hyun Kim, Yongin (KR); Mi-Kyung Kim, Yongin (KR); Se-Hun Kim, Yongin (KR); Hwan-Hee Cho, Yongin (KR); Sam-Il Kho, Yongin (KR); Hyoung-Kun Kim, Yongin (KR); Chang-Woong Chu, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 465 days.

(21) Appl. No.: 14/326,881

(22) Filed: Jul. 9, 2014

(65) Prior Publication Data

US 2015/0048332 A1    Feb. 19, 2015

(30) Foreign Application Priority Data

Aug. 19, 2013   (KR) .................. 10-2013-0098142

(51) Int. Cl.
*H01L 51/50* (2006.01)
*H01L 51/00* (2006.01)

(52) U.S. Cl.
CPC ........ *H01L 51/0058* (2013.01); *H01L 51/006* (2013.01); *H01L 51/0072* (2013.01); *H01L 51/5056* (2013.01)

(58) Field of Classification Search
None
See application file for complete search history.

(56) References Cited

U.S. PATENT DOCUMENTS 8,188,315 B2   5/2012   Hwang et al.
2011/0127495 A1   6/2011   Hong et al.
(Continued)

FOREIGN PATENT DOCUMENTS

KR   10-0573137 B1   4/2006
KR   10-2009-0051141   5/2009
(Continued)

*Primary Examiner* — Gregory Clark
(74) *Attorney, Agent, or Firm* — Lee & Morse, P.C.

(57) ABSTRACT

An amine-based compound is represented by Formula 1 below:

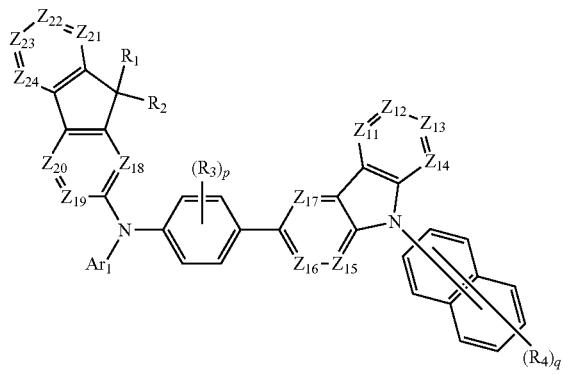

<Formula 1> wherein $Z_{11}$ to $Z_{24}$, $R_1$ to $R_4$ and $Ar_1$ are as indicated in the specification. An organic light-emitting diode includes the amine-based compound.

17 Claims, 1 Drawing Sheet

(56) References Cited

U.S. PATENT DOCUMENTS

| | | | |
|---|---|---|---|
| 2011/0193074 A1 | 8/2011 | Lee et al. | |
| 2012/0043531 A1* | 2/2012 | Jung | H01L 51/006 257/40 |
| 2012/0091438 A1 | 4/2012 | Yabunouchi et al. | |
| 2012/0211733 A1 | 8/2012 | Hwang et al. | |
| 2012/0267617 A1* | 10/2012 | Kaiser | H01L 51/5052 257/40 |

FOREIGN PATENT DOCUMENTS

| | | | |
|---|---|---|---|
| KR | 10-2010-0039815 | 4/2010 | |
| KR | 10-2012-0022861 | 3/2012 | |
| KR | 10-2012-0119881 A | 10/2012 | |
| WO | WO 2012/043996 * | 4/2012 | C09K 11/06 |

* cited by examiner

AMINE-BASED COMPOUND AND ORGANIC LIGHT-EMITTING DIODE INCLUDING THE SAME

CROSS-REFERENCE TO RELATED APPLICATION

Korean Patent Application No. 10-2013-0098142, filed on Aug. 19, 2013, in the Korean Intellectual Property Office, and entitled: "Amine-Based Compound and Organic Light-Emitting Diode Including The Same," is incorporated by reference herein in its entirety.

BACKGROUND

1. Field

One or more embodiments relate to an amine-based compound and an organic light-emitting diode including the same.

2. Description of the Related Art

Organic light-emitting diodes (OLEDs), which are self-emitting diodes, have advantages such as wide viewing angle, excellent contrast, quick response, high brightness, excellent driving voltage characteristics, and can provide multicolored images.

A typical OLED has a structure including a substrate, an anode formed on the substrate, and a hole transport layer (HTL), an emission layer (EML), an electron transport layer (ETL), and a cathode that are sequentially stacked on the anode. The HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. Carriers such as the holes and electrons recombine in the EML, thereby generating excitons. Then, when the excitons drop from an excited state to a ground state, light is emitted.

SUMMARY

Embodiments are directed to an amine-based compound is represented by Formula 1 below:

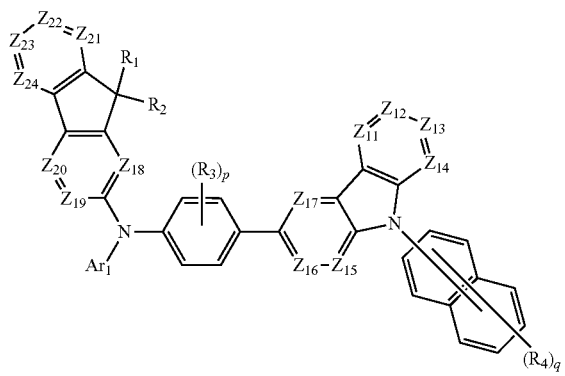

<Formula 1> wherein, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$;

$Ar_1$ is selected from:

a C3-C10 cycloalkyl group, a C3-C10 heterocycloalkyl group, a C3-C10 cycloalkenyl group, a C3-C10 heterocycloalkenyl group, a C6-C60 aryl group, and a C2-C60 heteroaryl group; and a C3-C10 cycloalkyl group, a C3-C10 heterocycloalkyl group, a C3-C10 cycloalkenyl group, a C3-C10 heterocycloalkenyl group, a C6-C60 aryl group, and a C2-C60 heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C1-C60 alkyl group, a C2-C60 alkenyl group, a C2-C60 alkynyl group, a C1-C60 alkoxy group, a C3-C10 cycloalkyl group, a C3-C10 heterocycloalkyl group, a C3-C10 cycloalkenyl group, a C3-C10 heterocycloalkenyl group, a C6-C60 aryl group, a C6-C60 aryloxy group, a C6-C60 arylthio group, and a C2-C60 heteroaryl group;

$R_1$ and $R_2$ are each independently selected from:

a C1-C60 alkyl group, a C2-C60 alkenyl group, a C2-C60 alkynyl group, and a C1-C60 alkoxy group;

a C1-C60 alkyl group, a C2-C60 alkenyl group, a C2-C60 alkynyl group, and a C1-C60 alkoxy group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a C3-C10 cycloalkyl group, a C3-C10 heterocycloalkyl group, a C3-C10 cycloalkenyl group, a C3-C10 heterocycloalkenyl group, a C6-C60 aryl group, a C6-C60 aryloxy group, a C6-C60 arylthio group, and a C2-C60 heteroaryl group;

a C3-C10 cycloalkyl group, a C3-C10 heterocycloalkyl group, a C3-C10 cycloalkenyl group, a C3-C10 heterocycloalkenyl group, a C6-C60 aryl group, and a C2-C60 heteroaryl group; and a C3-C10 cycloalkyl group, a C3-C10 heterocycloalkyl group, a C3-C10 cycloalkenyl group, a C3-C10 heterocycloalkenyl group, a C6-C60 aryl group, and a C2-C60 heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_3$, $R_4$ and $R_{11}$ to $R_{24}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —$N(Q_{11})(Q_{12})$, —$Si(Q_{13})(Q_{14})(Q_{15})$, and —$B(Q_{16})(Q_{17})$ (here, $Q_{11}$ and $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

p is an integer of 1 to 4; and q is an integer of 1 to 7.

Embodiments are also directed to an organic light-emitting diode including a first electrode; a second electrode facing the first electrode; and an organic layer between the first electrode and the second electrode, the organic layer including at least one of the above-described amine-based compounds.

BRIEF DESCRIPTION OF THE DRAWING

Features will become apparent to those of skill in the art by describing in detail exemplary embodiments with reference to the attached drawings in which.

DETAILED DESCRIPTION

Figure 1:
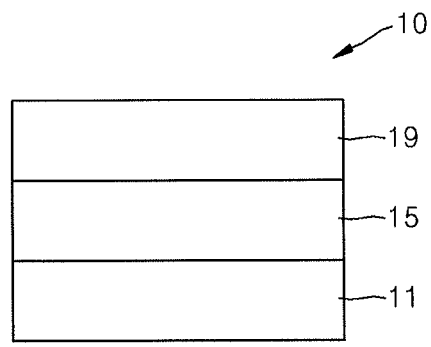
FIG. 1 illustrates a schematic view of a structure of an organic light-emitting diode (OLED) according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

According to an aspect, there is provided an organic light-emitting diode (OLED) including an amine-based compound represented by Formula 1 below:

<Formula 1>

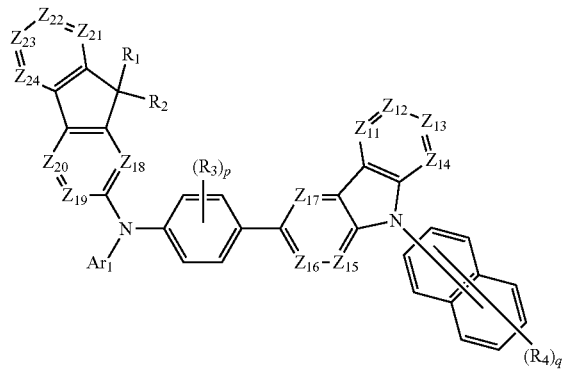

In Formula 1 above, $Z_{11}$ may be N or $C(R_{11})$, $Z_{12}$ may be N or $C(R_{12})$, $Z_{13}$ may be N or $C(R_{13})$, $Z_{14}$ may be N or $C(R_{14})$, $Z_{15}$ may be N or $C(R_{15})$, $Z_{16}$ may be N or $C(R_{16})$, $Z_{17}$ may be N or $C(R_{17})$, $Z_{18}$ may be N or $C(R_{18})$, $Z_{19}$ may be N or $C(R_{19})$, $Z_{20}$ may be N or $C(R_{20})$, $Z_{21}$ may be N or $C(R_{21})$, $Z_{22}$ may be N or $C(R_{22})$, $Z_{23}$ may be N or $C(R_{23})$, and $Z_{24}$ may be N or $C(R_{24})$.

For example, in Formula 1 above, $Z_{11}$ may be $C(R_{11})$, $Z_{12}$ may be $C(R_{12})$, $Z_{13}$ may be $C(R_{13})$, $Z_{14}$ may be $C(R_{14})$, $Z_{15}$ may be $C(R_{15})$, $Z_{16}$ may be $C(R_{16})$, $Z_{17}$ may be $C(R_{17})$, $Z_{18}$ may be $C(R_{18})$, $Z_{19}$ may be $C(R_{19})$, $Z_{20}$ may be $C(R_{20})$, $Z_{21}$ may be $C(R_{21})$, $Z_{22}$ may be $C(R_{22})$, $Z_{23}$ may be $C(R_{23})$, and $Z_{24}$ may be $C(R_{24})$.

According to an embodiment, the amine-based compound may be represented by Formula 1A or Formula 1B below:

<Formula 1A>

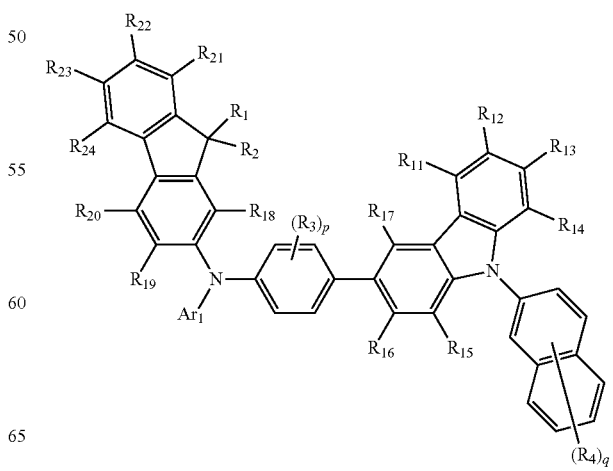

-continued

<Formula 1B>

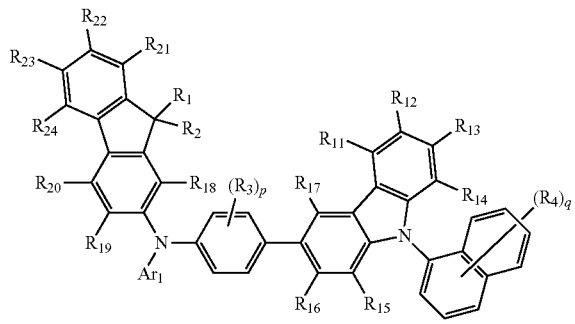

Substituents of Formulae 1A and 1B used herein will now be described in detail.

$Ar_1$ in Formula 1 above may be selected from:

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, $Ar_1$ in Formula 1 above may be selected from a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, and a benzocarbazolyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, a dibenzofuranyl group, a dibenzothiophenyl group, and a benzocarbazolyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

In some embodiments, $Ar_1$ may be selected from among:

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

According to another embodiment, $Ar_1$ in Formula 1 above may be represented by one of Formulae 3-1 to 3-20 below, as examples:

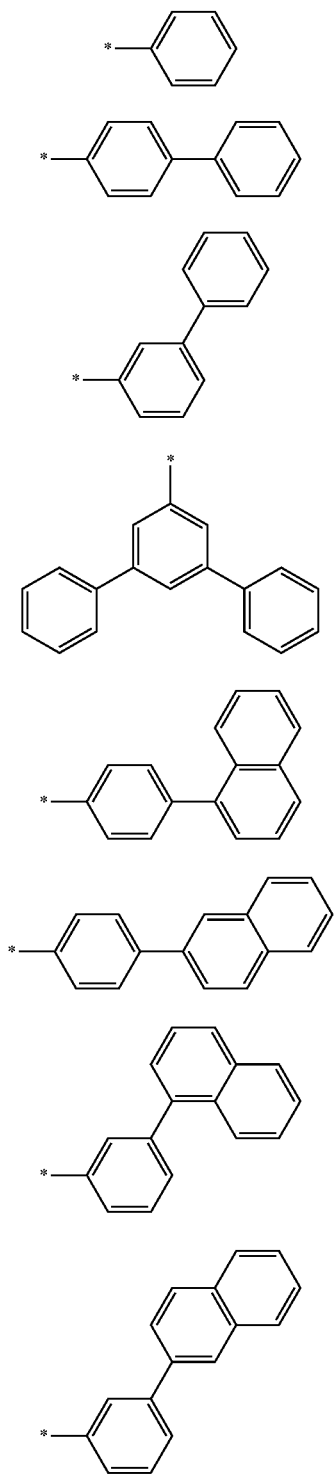

Formula 3-1

Formula 3-2

Formula 3-3

Formula 3-4

Formula 3-5

Formula 3-6

Formula 3-7

Formula 3-8

-continued

Formula 3-9

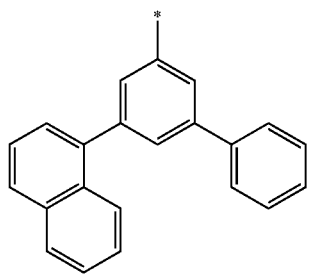

Formula 3-10

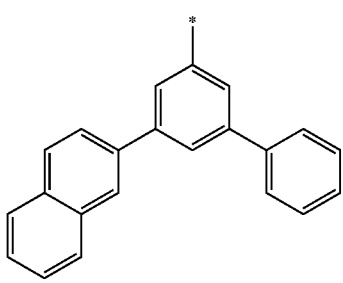

Formula 3-11

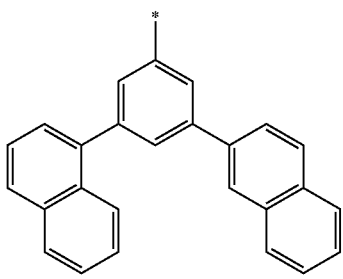

Formula 3-12

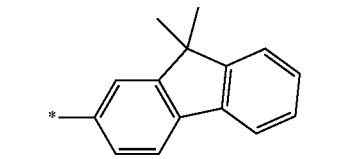

Formula 3-13

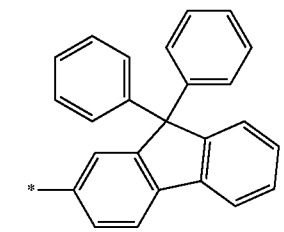

Formula 3-14

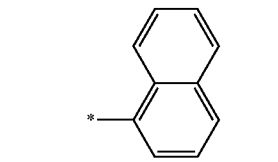

Formula 3-15

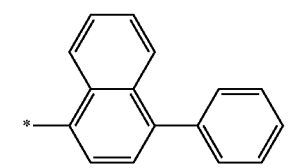

-continued

Formula 3-16

Formula 3-17

Formula 3-18

Formula 3-19

Formula 3-20

In Formulae 3-1 to 3-20 above, * indicates a binding site with a nitrogen atom (N) in Formula 1 above.

$R_1$ and $R_2$ in Formula 1 above may be each independently:

a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

For example, $R_1$ and $R_2$ in Formula 1 above may be each independently:

a $C_1$-$C_{20}$ alkyl group;

a $C_1$-$C_{20}$ alkyl group substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

In some embodiments, $R_1$ and $R_2$ in Formula 1 above may be each independently selected from a methyl group, an ethyl group, a propyl group, a butyl group, a pentyl group, a hexyl group, a heptyl group, and groups of Formulae 3-1 to 3-20, as examples.

$R_3$, $R_4$ and $R_{11}$ to $R_{24}$ in Formula 1 above may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —N($Q_{11}$)($Q_{12}$), —Si($Q_{13}$)($Q_{14}$)($Q_{15}$), and —B($Q_{16}$)($Q_{17}$) (here, $Q_{11}$ and $Q_{17}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group).

For example, $R_3$, $R_4$ and $R_{11}$ to $R_{24}$ in Formula 1 above may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{20}$ alkyl group;

a $C_1$-$C_{20}$ alkyl group substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a cinnolinyl group, a carbazolyl group, and a triazinyl group.

In some embodiments, $R_3$, $R_4$ and $R_{11}$ to $R_{24}$ in Formula 1 above may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{20}$ alkyl group, as examples.

In some embodiments, $R_3$, $R_4$ and $R_{11}$ to $R_{24}$ in Formula 1 above may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and groups of Formulae 3-1 to 3-20.

In Formula 1 above, p refers to the number of $R_3$s, and may be an integer of 1 to 4. When p is 2 or greater, the $R_3$s may be identical to or different from each other. In Formula 1 above, q refers to the number of $R_4$s, and may be an integer of 1 to 7. When q is 2 or greater, $R_4$s may be identical to or different from each other. For example, p and q may be 1 or 2.

According to another embodiment, the amine-based compound may be represented by Formula 1A or Formula 1B, wherein $Ar_1$ in Formulae 1A and 1B may be selected from:

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

$R_1$ and $R_2$ in Formulae 1A and 1B may be each independently selected from:

a $C_1$-$C_{20}$ alkyl group;

a $C_1$-$C_{20}$ alkyl group substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

$R_3$, $R_4$ and $R_{11}$ to $R_{24}$ in Formulae 1A and 1B may be each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{20}$ alkyl group;

a $C_1$-$C_{20}$ alkyl group substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

According to another embodiment, the amine-based compound may be represented by Formula 1A or Formula 1B, wherein $Ar_1$ in Formulae 1A and 1B may be selected from groups of Formulae 3-1 to 3-20 above.

R₁ and R₂ in Formulae 1A and 1B may be each independently selected from a methyl group, an ethyl group, a propyl group, a butyl group, a pentyl group, a hexyl group, a heptyl group, and groups of Formulae 3-1 to 3-20 above.

R₃, R₄ and R₁₁ to R₂₄ in Formulae 1A and 1B may be each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and groups of Formulae 3-1 to 3-20 above.

According to another embodiment, the amine-based compound may be represented by Formula 1A or Formula 1B, wherein Ar₁ in Formulae 1A and 1B may be selected from groups of Formulae 3-1 to 3-20 above.

R₁ and R₂ in Formulae 1A and 1B may be each independently selected from a methyl group, an ethyl group, a propyl group, a butyl group, a pentyl group, a hexyl group, a heptyl group, and groups of Formulae 3-1 to 3-20 above.

R₃, R₄ and R₁₁ to R₂₄ in Formulae 1A and 1B may be each independently a hydrogen atom.

The amine-based compound may be one of Compounds 1 to 5 below, as examples:

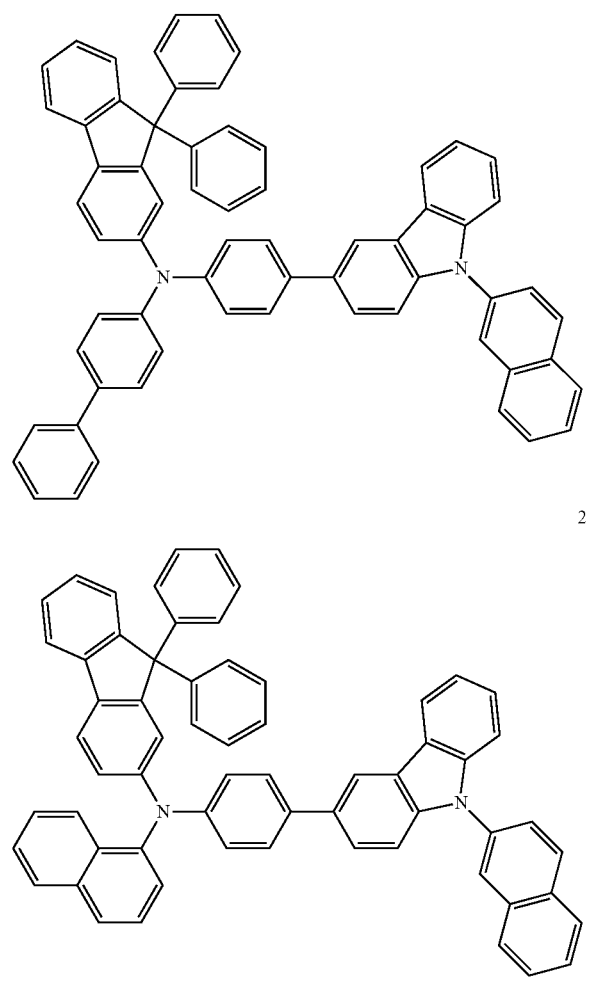

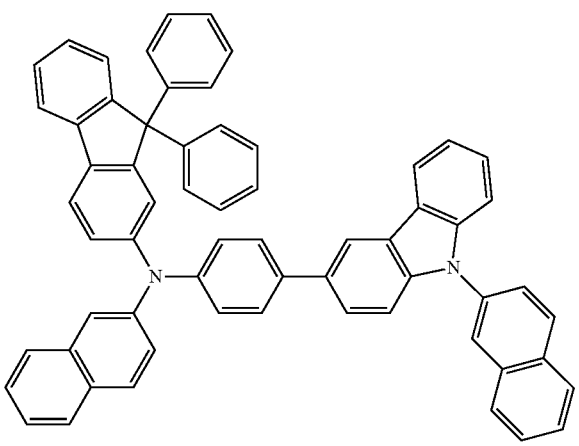

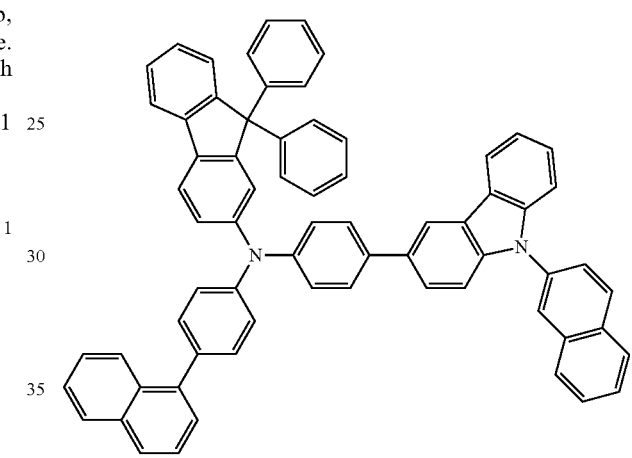

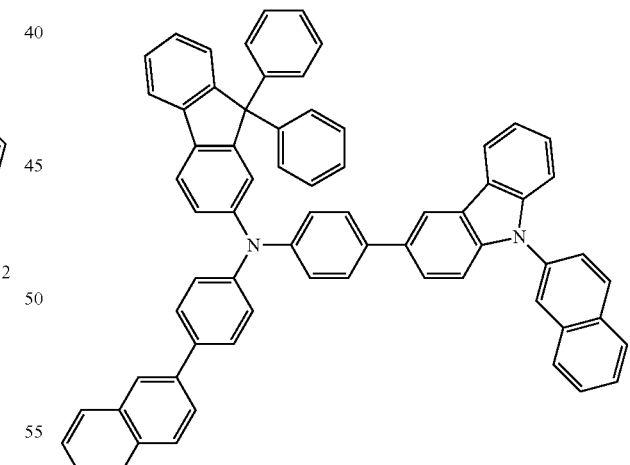

In Formula 1 above, an "N" of a carbazole ring may be coupled with an unsubstituted naphthyl group or with a naphthyl group that is substituted with at least one of the R₄ groups". Accordingly, a conjugation effect between the "N" of the carbazole ring and the unsubstituted naphthyl group or with the naphthyl group that is substituted with at least one of the R₄ groups" is improved. Thus, the amine-based compound of Formula 1 above may have excellent electrical stability when transferring charges.

In addition, a central "N" in Formula 1 above is directly coupled with "a fluorene-based ring" without a linker, and thus the amine-based compound of Formula 1 above may have an excellent mobility of holes.

In this regard, an organic light-emitting diode (OLED) including the amine-based compound of Formula 1 above may have characteristics of high efficiency, high brightness, and long lifespan.

The amine-based compound of Formula 1 may be synthesized by using a suitable organic synthesis method. A method of preparing the amine-based compound will be described in detail below with reference to the following synthesis examples and other examples.

The amine-based compound of Formula 1 above may be used between a pair of electrodes of an OLED. For example, the amine-based compound may be in at least one of a hole injection layer (HIL), a hole transport layer (HTL), and a functional layer having both hole injection and hole transport capabilities.

According to an embodiment, an OLED is provided that includes a first electrode, a second electrode facing the first electrode, and an organic layer that is disposed between the first electrode and the second electrode and includes an emission layer, the organic layer including at least one of the amine-based compound of Formula 1 above.

The phrase "[an organic layer) includes at least one the amine-based compound of Formula 1 above" used herein may be interpreted as indicating that [an organic layer) may include one kind of an amine-based compound represented by Formula 1, or that [an organic layer] may include at least two different kinds of an amine-based compound represented by Formula 1.

For example, the organic layer may include only Compound 1 above as the amine-based compound. In this regard, Compound 1 above may be present in an HTL of an OLED. In other implementations, the organic layer may include Compound 1 and Compound 2 as the amine-based compound. In this regard, Compound 1 and Compound 2 may be present in a single layer (for example, Compound 1 and Compound 2 may both exist in an HTL), or may be present in different layers (for example, Compound 1 may be present in an HTL and Compound 2 may be present in an emission layer (EML)).

The organic layer may include i) a hole transport region that is disposed between the first electrode and the EML and includes at least one layer selected from an HIL, an HTL, a functional layer having both hole injection and hole transport capabilities, a buffer layer, and an electron blocking layer (EBL); and ii) an electron transport region that is disposed between the second electrode and the EML and includes at least one layer selected from a hole blocking layer (HBL), an electron transport layer (ETL), and an electron injection layer (EIL). The amine-based compound may be present in the hole transport region, and the hole transport region may further include a p-dopant described later. In other implementations, the hole transport region may include an HTL, and the HLT may include the amine-based compound.

The term "organic layer" used herein refers to a single- and/or multi-layer disposed between the first electrode and the second electrode of the OLED.

FIG. 1 illustrates a schematic sectional view of an OLED 10 according to an embodiment. Hereinafter, a structure and a method of manufacturing the OLED 10 according to an embodiment are described in detail with reference to FIG. 1.

A substrate (not illustrated) may be disposed on the lower part of a first electrode 11 or on top of a second electrode 19. The substrate may be a suitable substrate for use in an OLED. For example, the substrate may be a glass substrate or a transparent plastic substrate with excellent mechanical strength, thermal stability, transparency, surface smoothness, ease of handling, and water resistance.

The first electrode 11 may be formed by, for example, depositing or sputtering a material for the first electrode 11 on the substrate. When the first electrode 11 is an anode, the material for the first electrode 11 may be selected from materials with a high work function to enable ease of hole injection. The first electrode 11 may be a reflective electrode or a transmission electrode. The material for the first electrode may be a transparent material with high conductivity. Examples of such a material include indium tin oxide (ITO), indium zinc oxide (IZO), tin oxide ($SnO_2$), or zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 11 may be used as a reflective electrode.

The first electrode 11 may have a single-layer structure or a multi-layer structure including at least two layers. For example, the first electrode 11 may have a three-layered structure of ITO/Ag/ITO.

The organic layer 15 may be disposed on the first electrode 11.

The organic layer 15 may include an HIL, an HTL, a buffer layer, an EML, an ITL, and an ETL.

An HIL may be formed on the first electrode 11 by using various methods, such as vacuum deposition spin coating, Langmuir-Blodgett (LB) deposition.

When the HIL is formed using vacuum deposition, vacuum deposition conditions may vary according to the compound that is used to form the HIL and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec.

When the HIL is formed using spin coating, the coating conditions may vary according to the compound that is used to form the HIL, and the desired structure and thermal properties of the HIL to be formed. For example, the coating rate may be in the range of about 2,000 rpm to about 5,000 rpm, and a temperature at which a heat treatment is performed to remove a solvent after coating may be in the range of about 80° C. to about 200° C.

As a material for the HIL, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris (3-methylphenylphenylamino) triphenylamine (m-MTDATA), N,N'-di(1-naphthyl)-N,N'-diphenylbenzidine(NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (pani/CSA), or (polyaniline)/poly(4-styrenesulfonate) (PANI/PSS) may be used, as examples.

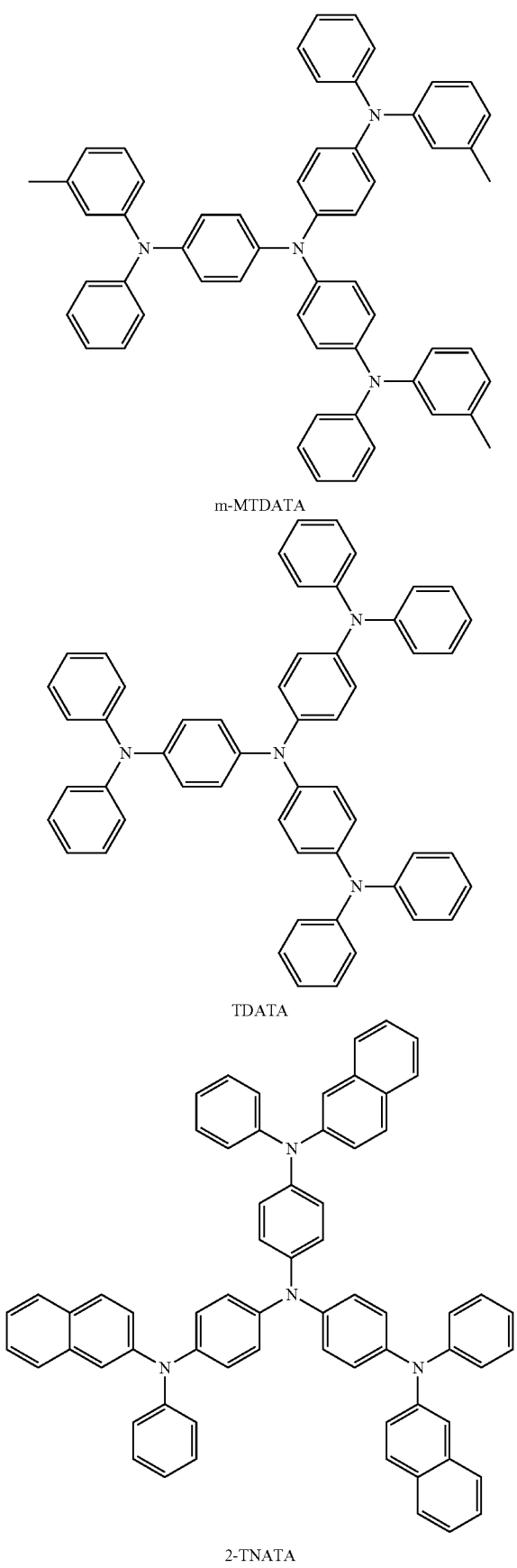

In other implementations, the HIL may include the amine-based compound of Formula 1 above as a hole injection material.

A thickness of the HIL may be in a range of about 100 Å to about 10,000 Å, for example, about 100 Å to about 1,000 Å. When the thickness of the HIL is within the range described above, the HIL may have satisfactory hole injection characteristics without a substantial increase in a driving voltage.

An HTL may be formed on the HIL by using vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to the compound that is used to form the HTL.

As a material for the HTL, the amine-based compound of Formula 1 may be used.

A thickness of the HTL may be in a range of about 50 Å to about 20,000 Å, for example, about 100 Å to about 1,500 Å. When the thickness of the HTL is within the range described above, the HTL may have satisfactory hole transport characteristics without a substantial increase in a driving voltage.

Instead of, or in addition to, a separate HIL and HTL, the OLED 10 may include a functional layer having both hole injection and hole transport capabilities (hereinafter, referred to as a "H-functional layer"). The H-functional layer may include one or more materials selected from the materials for the HIL and the materials for the HTL. A thickness of the H-functional layer may be in a range of about 100 Å to about 10,000 Å, for example, about 100 Å to about 1,000 Å. When the thickness of the H-functional layer is within the range described above, the H-functional layer may have satisfactory hole injection and transport characteristics without a substantial increase in a driving voltage.

In some embodiments, the H-functional layer may include the amine-based compound of Formula 1 above.

The hole transport region may include at least one layer of the HIL, HTL, and the H-functional layer. The hole transport region may further include a charge-generating material in addition to suitable hole injection materials, suitable hole transport materials, and/or suitable H-functional materials, to improve the conductivity of a film.

The charge-generating material may be, for example, a p-dopant. The p-dopant may be one of a quinine derivative, a metal oxide, and a compound with a cyano group, as examples. Examples of the p-dopant include quinone derivatives, such as tetracyanoquinodimethane (TCNQ) or 2,3,5,6-tetrafluoro-tetracyano-1,4-benzoquinodimethane (F4-TCNQ); metal oxides, such as a tungsten oxide or a molybdenum oxide; or cyano group-containing compounds, such as Compound 200 below.

<Compound 200>

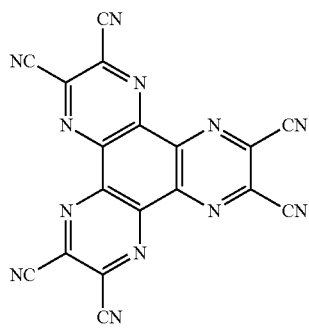

<F4-TCNQ>

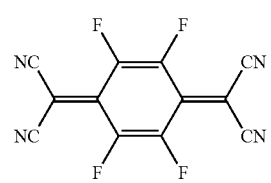

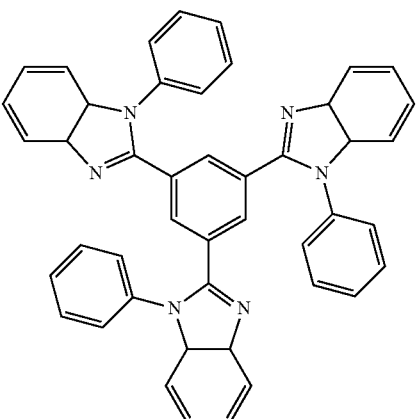

TPBI

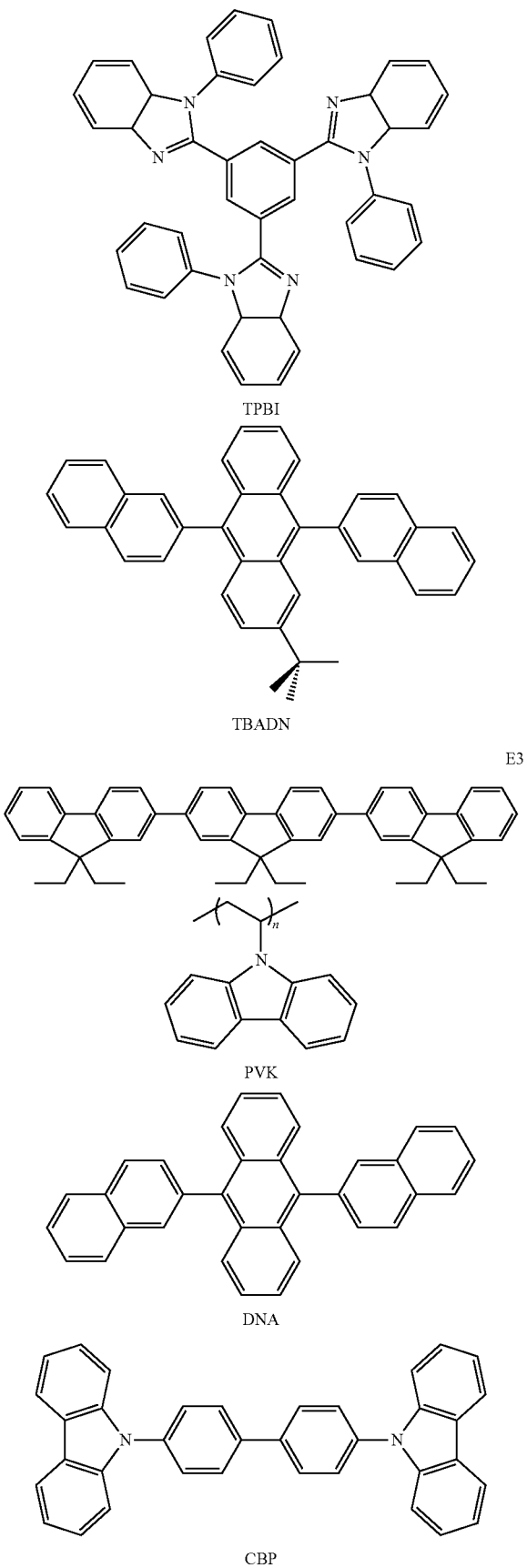

TBADN

E3

PVK

DNA

CBP

When the HIL, the HTL, or the H-functional layer further includes the charge-generating material, the charge-generating material may be homogeneously or non-homogeneously dispersed throughout the above-described layers.

A buffer layer may be disposed between at least one of the HIL, HTL, and the H-functional layer, and the EML. The buffer layer may compensate for an optical resonance distance of light according to a wavelength of the light emitted from the EML, and thus, the efficiency of the OLED may increase. The buffer layer may include a suitable hole injection material or a suitable hole transport material. In some embodiments, the buffer layer may include the same material as one of the materials included in the HIL, the HTL, and the H-functional layer that underlie the buffer layer.

An EML may be formed on the HTL, the H-functional layer, or the buffer layer by vacuum deposition, spin coating, casting, LB deposition, or the like. When the EML is formed using vacuum deposition or spin coating, the deposition and coating conditions may be similar to those for the formation of the HIL, although the conditions for deposition and coating may vary according to the material that is used to form the EML.

The EML may include a host and a dopant.

As the host, tris(8-quinolinorate)aluminum (Alq$_3$), 4,4'-N,N'-dicarbazol-biphenyl (CBP), poly(n-vinylcarbazole) (PVK), 9,10-di(naphthalen-2-yl)anthracene (DNA), TCTA, 1,3,5-tris(N-phenylbenzimidazole2-yl)benzene (TPBI), 3-tert-butyl-9,10-di(naphth-2-yl) anthracene (TBADN), E3, distyryl arylene (DSA), dmCBP (see Formula below), αβ-9-(1-Naphthyl)-10-(2-naphthyl)anthracene (αβ-ADN), or Compounds 501 to 509 shown below may be used, as examples.

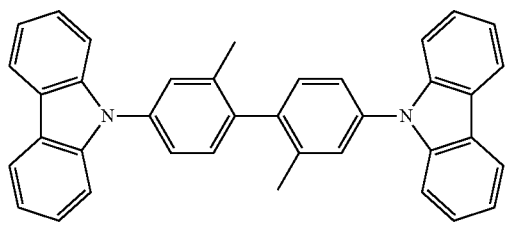
dmCBP
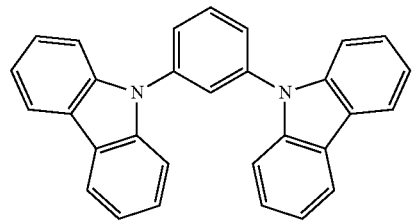
501
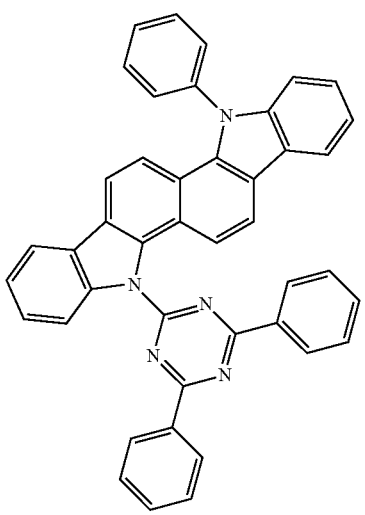
504
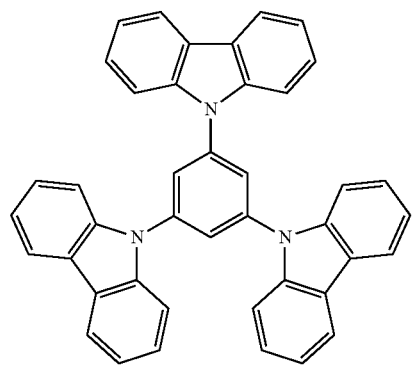
502
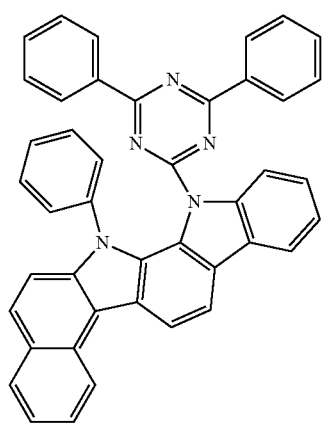
505
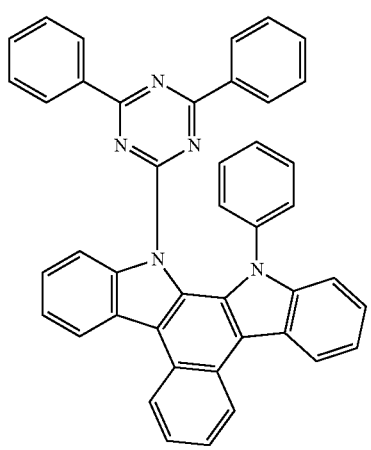
503
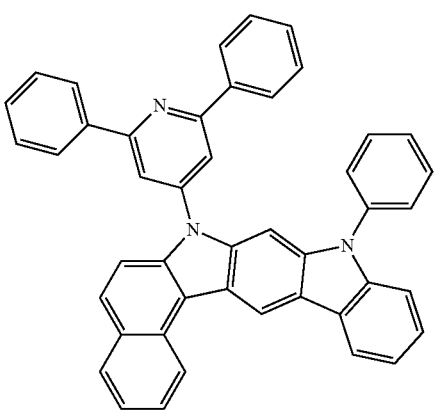
506

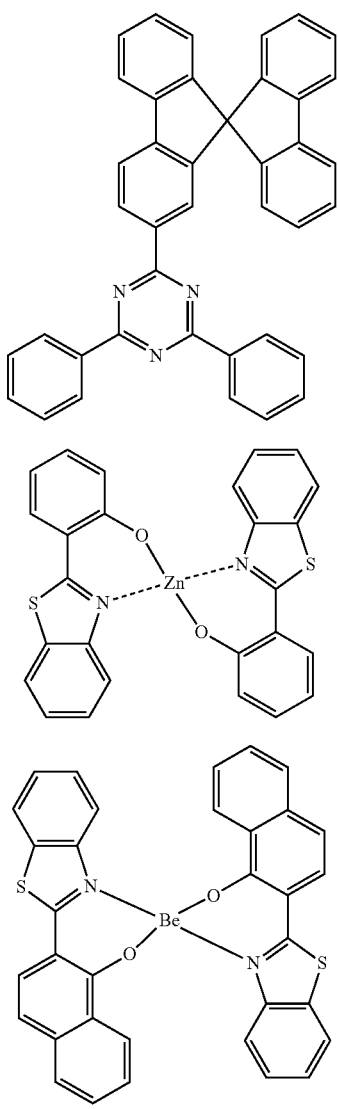

In some embodiments, an anthracene-based compound represented by Formulae 400 below may be used as the host.

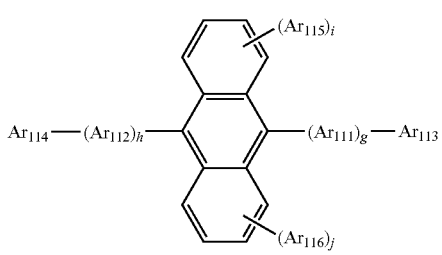

$Ar_{111}$ and $Ar_{112}$ in Formula 400 above may be each independently a substituted or unsubstituted $C_6$-$C_{60}$ arylene group; and $Ar_{113}$ to $Ar_{116}$ may be each independently a substituted or unsubstituted $C_1$-$C_{10}$ alkyl group, or a substituted or unsubstituted $C_6$-$C_{60}$ aryl group; and g, h, i, and j may be each independently an integer of 0 to 4.

For example, $Ar_{111}$ and $Ar_{112}$ in Formula 400 above may be selected from a phenylene group, a naphthylene group, a phenanthrenylene group, or a pyrenylene group; and a phenylene group, a naphthylene group, a phenanthrenylene group, a fluorenyl group, or a pyrenylene group, each substituted with at least one substituent selected from a phenyl group, a naphthyl group, and an anthryl group.

In Formula 400 above, g, h, i, and j may be each independently 0, 1, or 2.

$Ar_{113}$ to $Ar_{116}$ in Formula 400 may be each independently selected from:

a $C_1$-$C_{10}$ alkyl group substituted with at least one of a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenalenyl group, and a fluorenyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenalenyl group, and a fluorenyl group; and

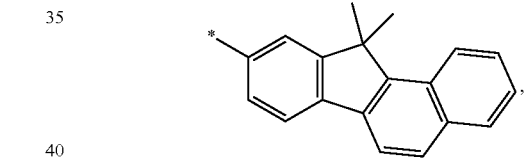

as examples.

For example, the anthracene-based compound of Formulae 400 above may be any one of compounds below.

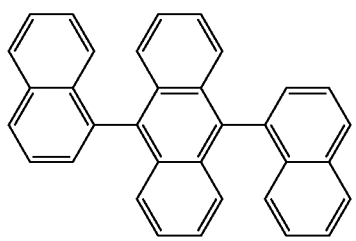

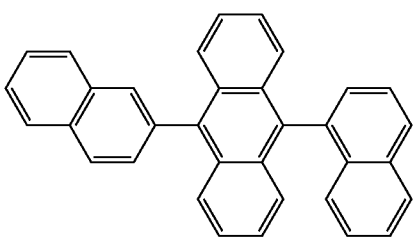

-continued
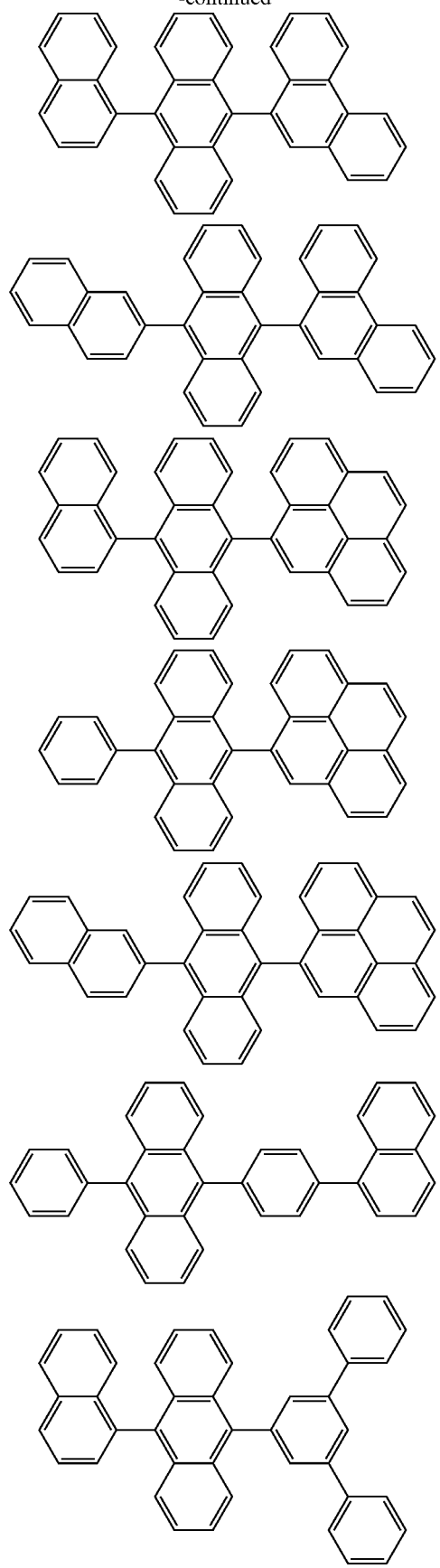
-continued
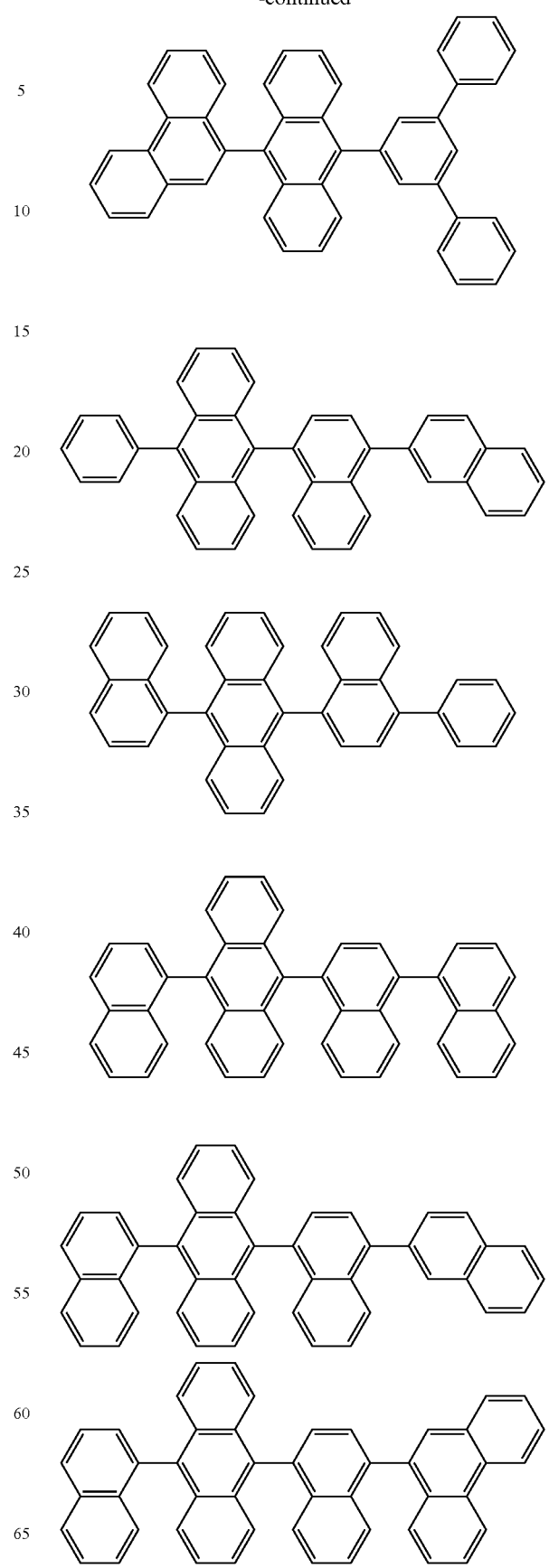

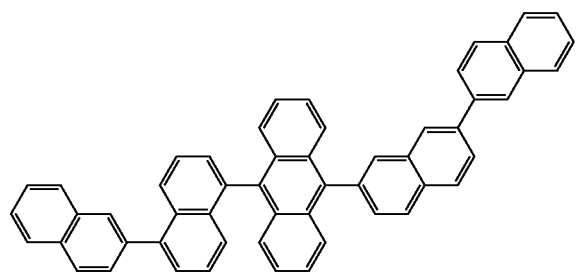
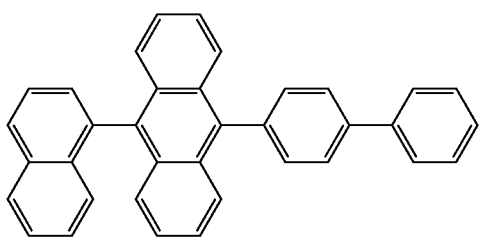
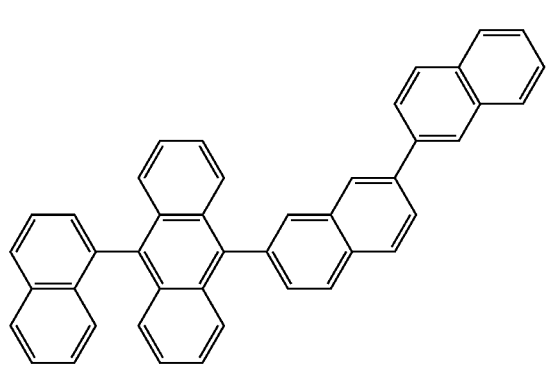
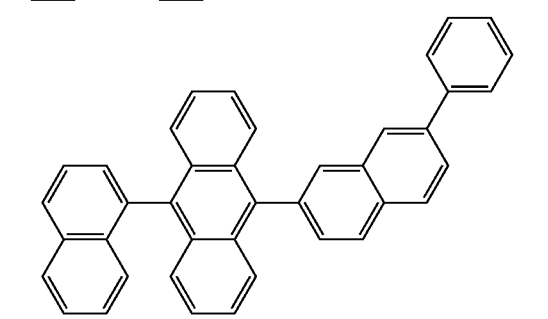
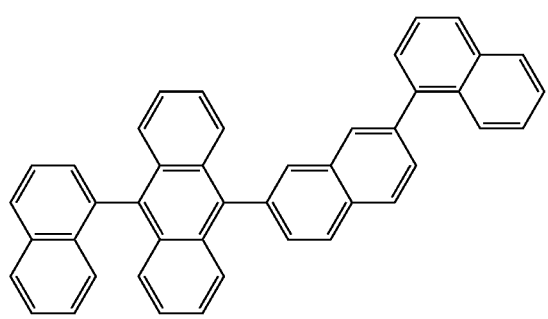
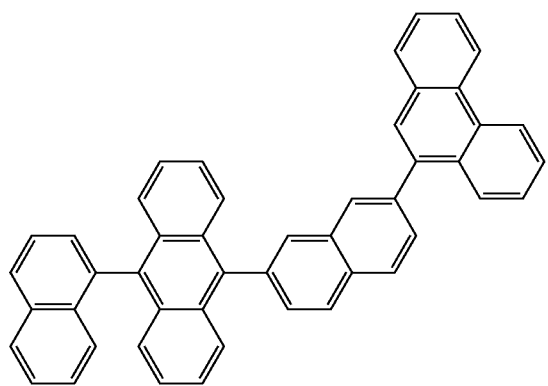

-continued
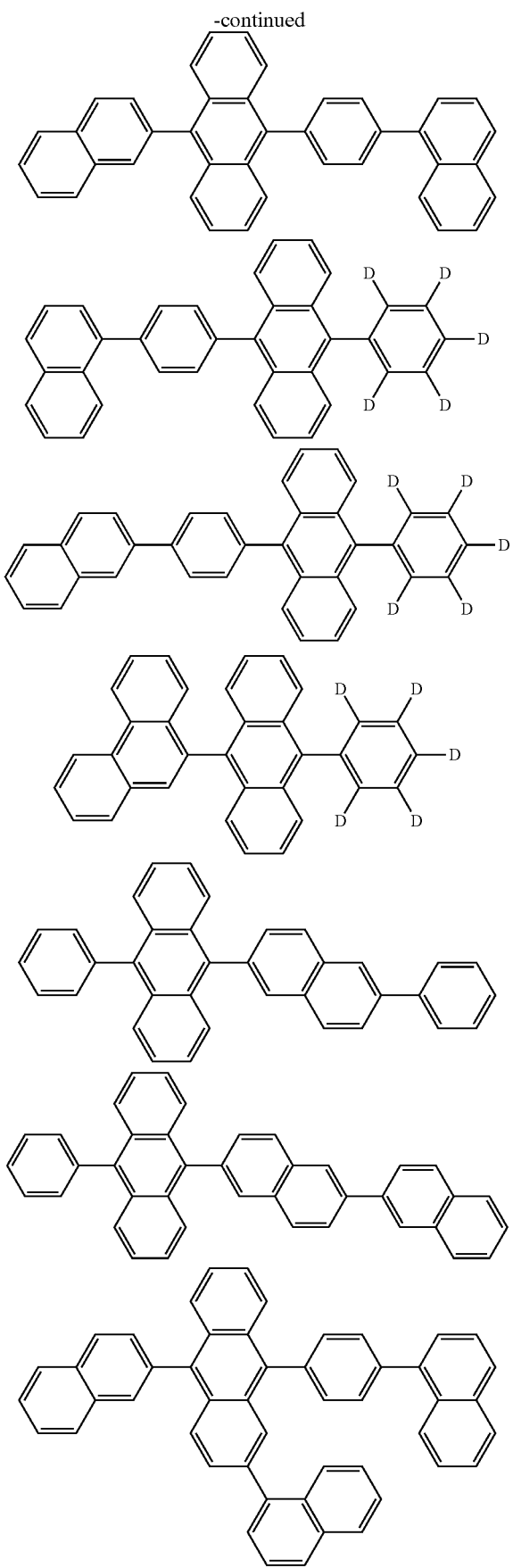
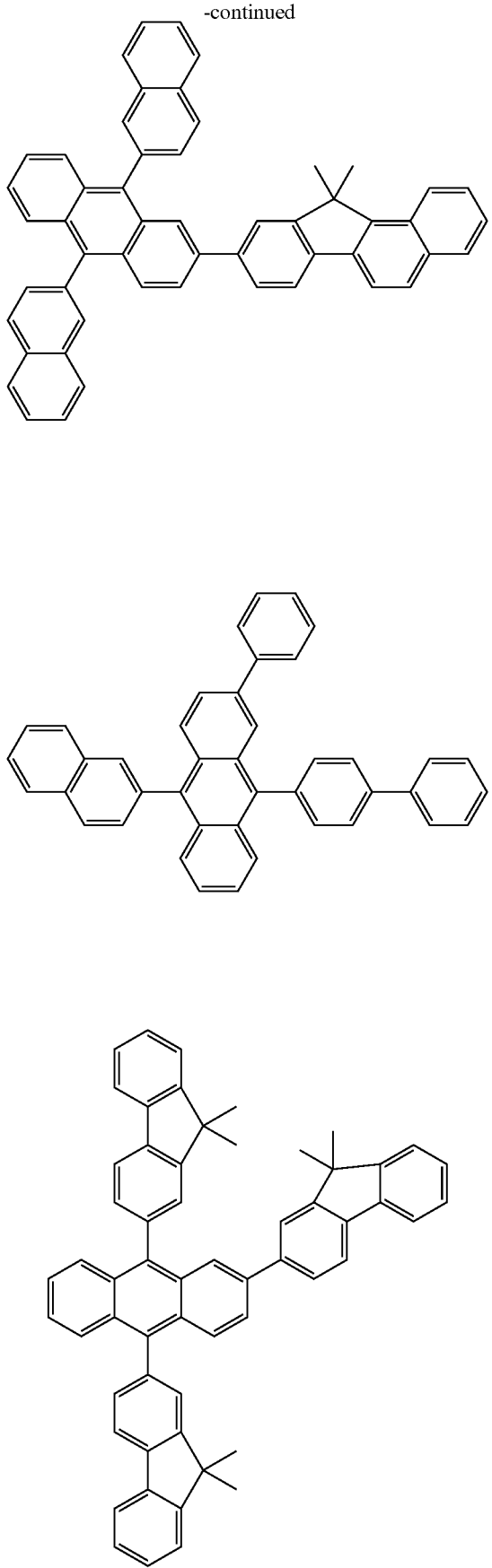

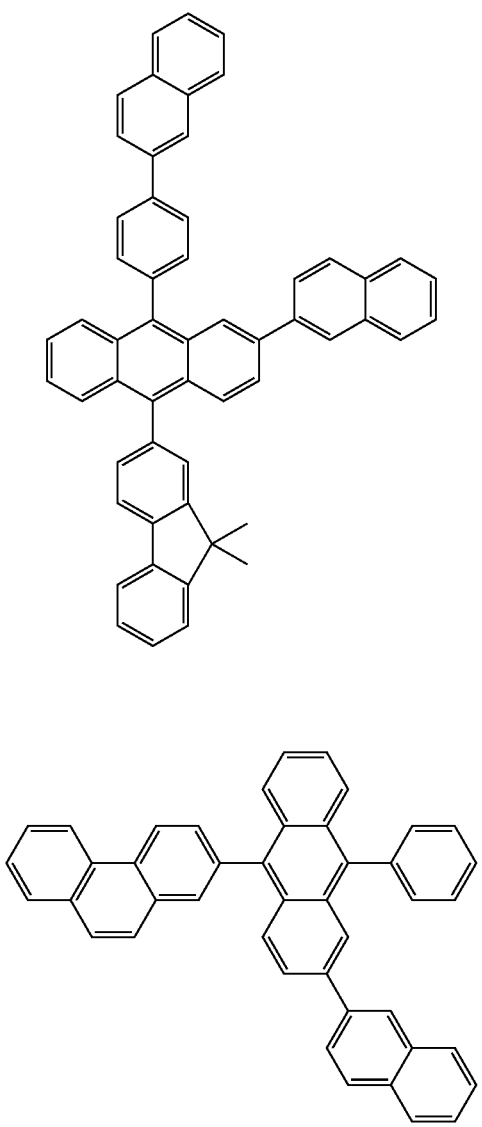

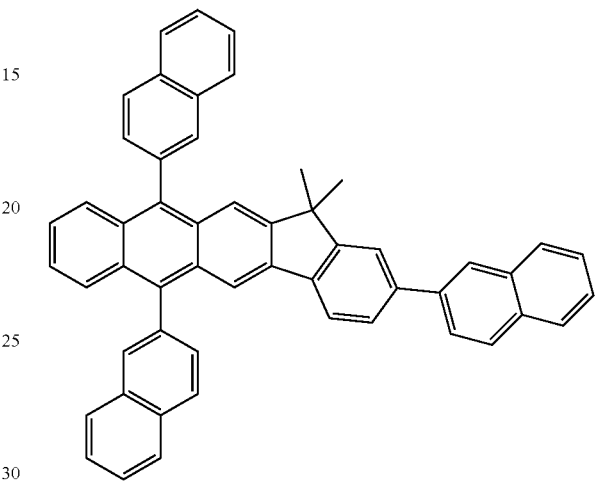

In some embodiments, an anthracene-based compound represented by Formula 401 below may be used as the host.

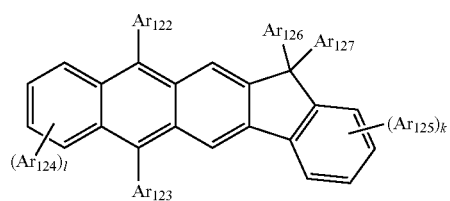

<Formula 401>

A detailed description of $Ar_{122}$ to $Ar_{125}$ in Formula 401 may be further understood with reference to the description of $Ar_{113}$ to $Ar_{116}$ in Formulae 400.

$Ar_{126}$ and $Ar_{127}$ in Formula 401 may be each independently a $C_1$-$C_{10}$ alkyl group (for example, a methyl group, an ethyl group, or a propyl group).

In Formula 401 above, k and l may be each independently an integer of 0 to 4. For example, k and l may be an integer of 0, 1, or 2.

In some implementations, the anthracene compound of Formula 401 above may be one of compounds below, as examples.

-continued

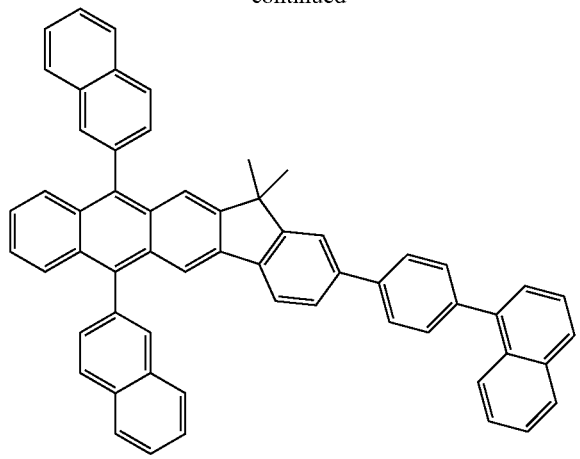

The dopant may be a fluorescent dopant and/or a phosphorescent dopant. The phosphorescent dopant may be an organic metal including iridium (Ir), platinum (Pt), osmium (Os), thallium (Ti), zirconium (Zr), hafnium (Hf), europium (Eu), terbium (Tb), or thulium (Tm).

When the OLED is a full color OLED, the EML may be patterned into a red EML, a green EML, and a blue EML. According to another embodiment, when a stack structure is provided including two or more a red EML, a green EML, and/or a blue EML, the EML may emit white light.

At least one layer of the red EML, the green EML, and the blue EML may include dopants below (ppy= phenylpyridine).

As examples, the compounds below may be used as a blue dopant.

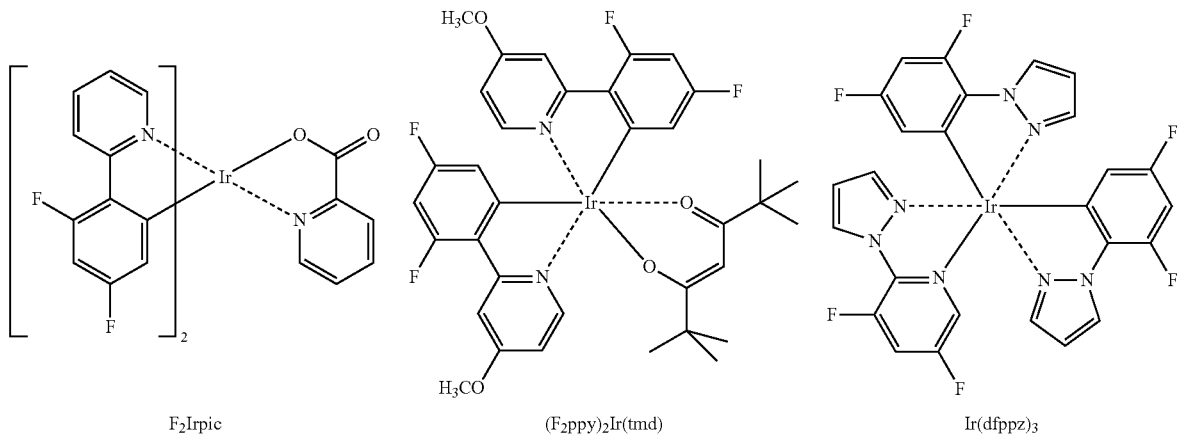

F₂Irpic     (F₂ppy)₂Ir(tmd)     Ir(dfppz)₃

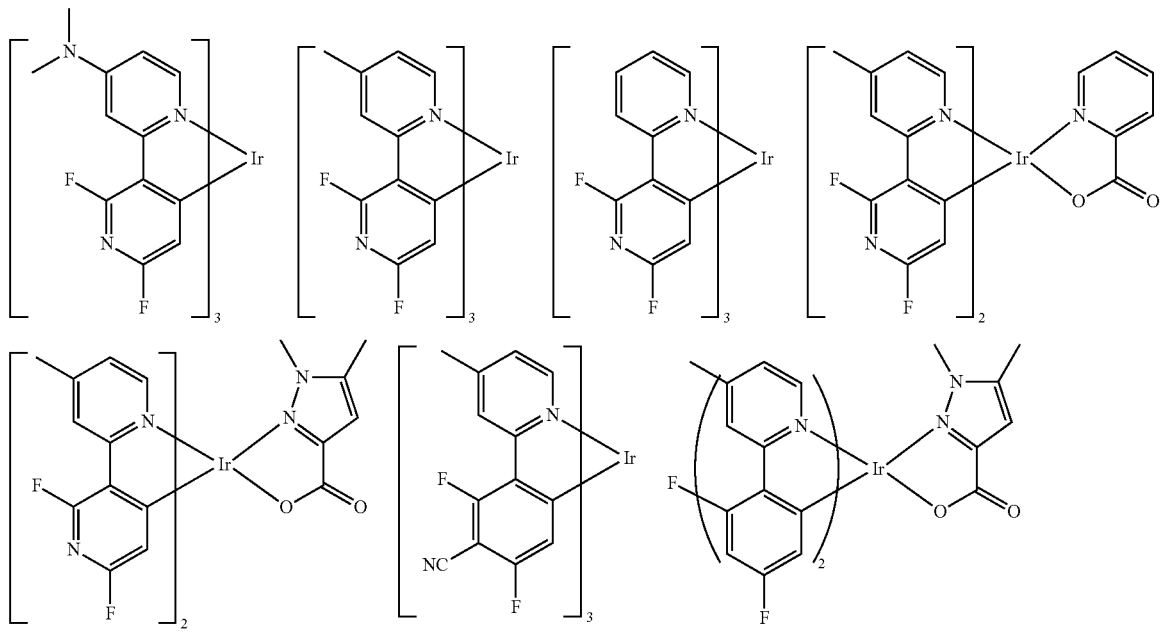

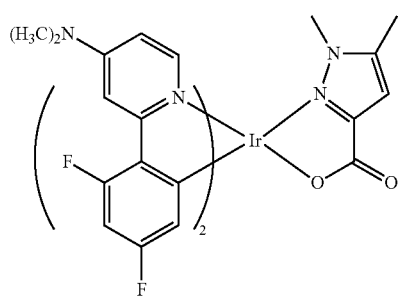
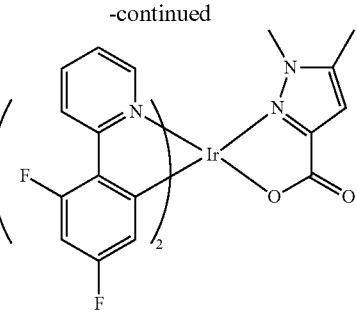
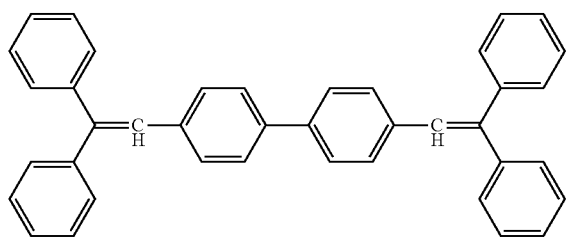
DPVBi
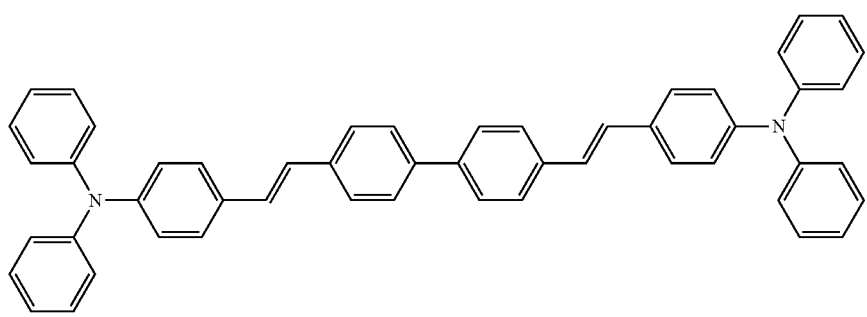
DPAVBi
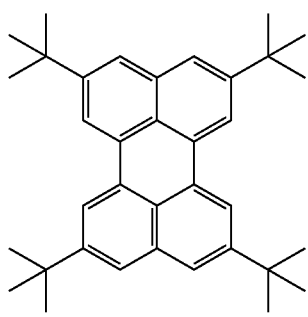
TBPe

As examples, the compounds below may be used as a red dopant. According to another implementation, DCM or DCJTB represented by the following formulae may be used as the red dopant.
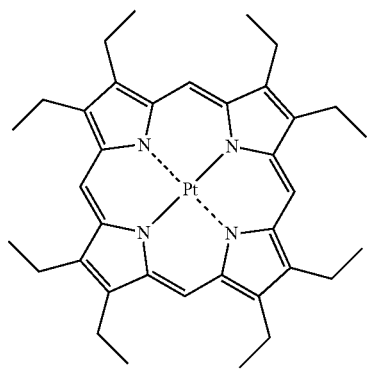
PtOEP
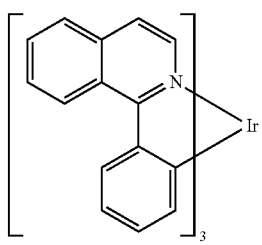
Ir(piq)₃
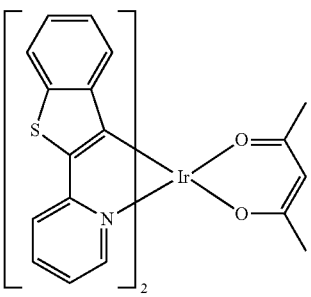
Btp₂Ir(acac)
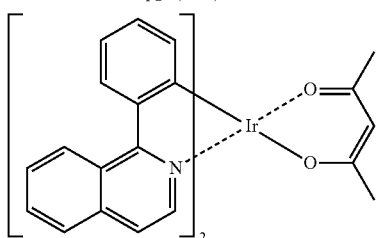
Ir(pq)₂(acac)
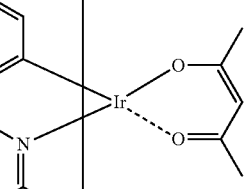
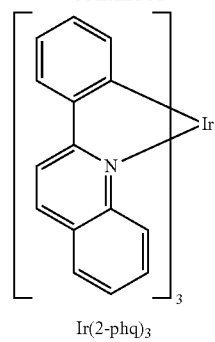
Ir(2-phq)₃
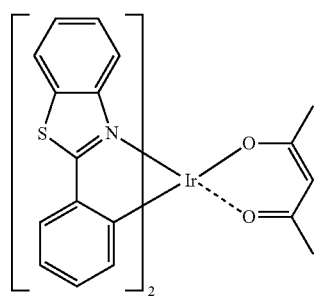
Ir(BT)₂(acac)
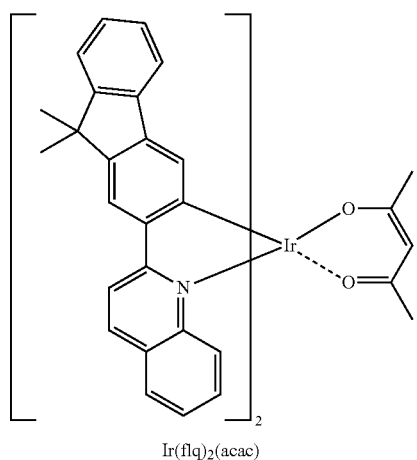
Ir(flq)₂(acac)
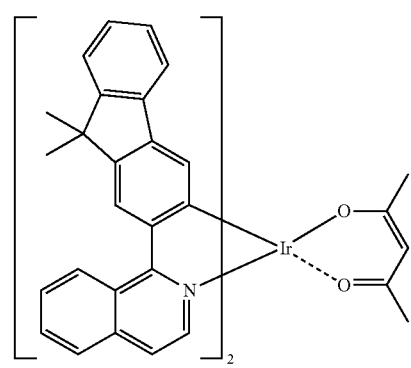
Ir(fliq)₂(acac)

As examples, the compounds below may be used as a green dopant. For example, C545T below may be used as the green dopant.

As examples, a dopant used in the EML may be a complex represented by the following formulae.

D4
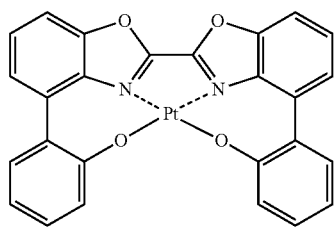
D5
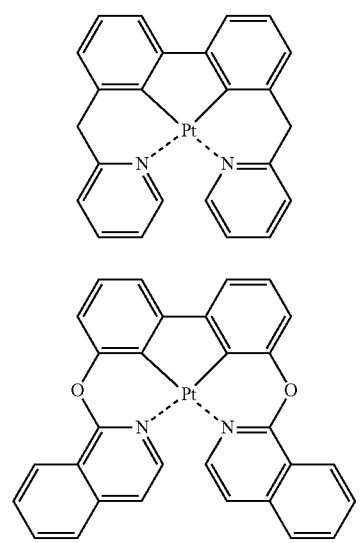
D6
D7
D8
D9
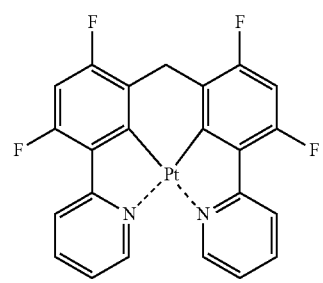
D10
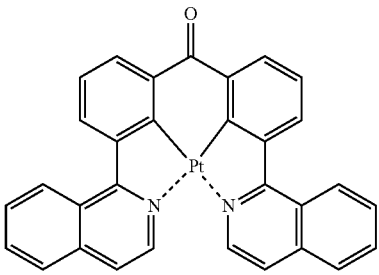
D11
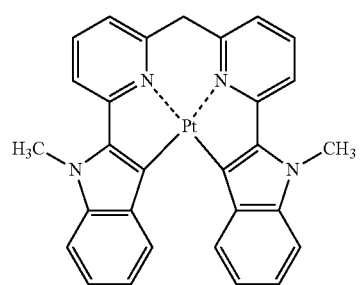
D12
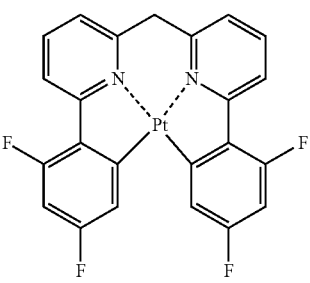
D13
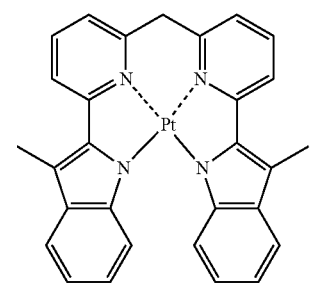
D14
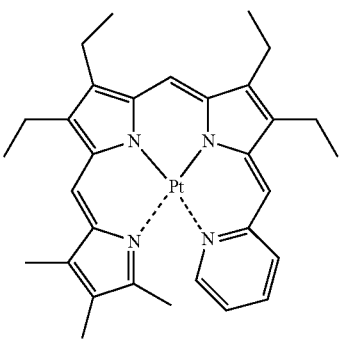

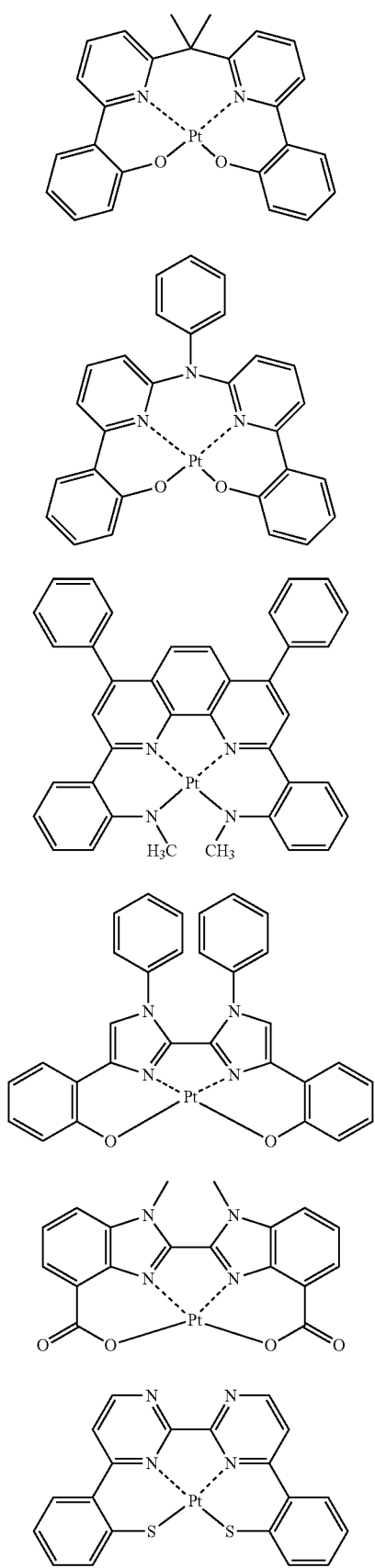

-continued
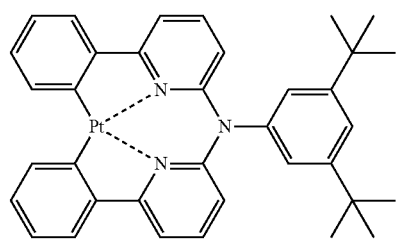
D26
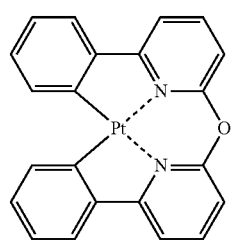
D27
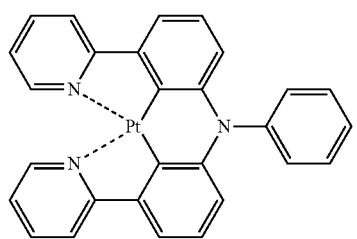
D28
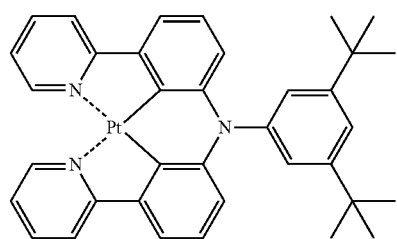
D29
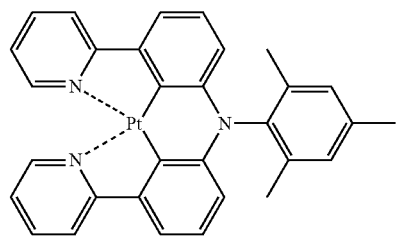
D30
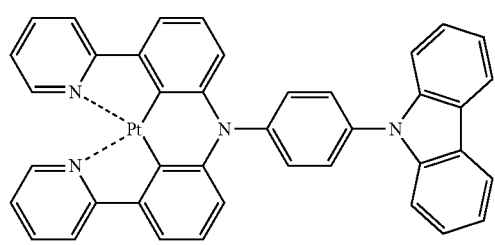
D31
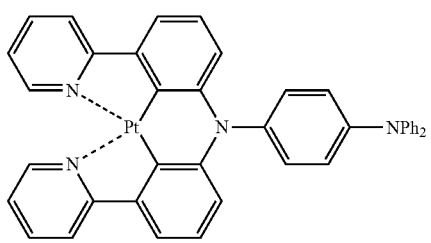
D32
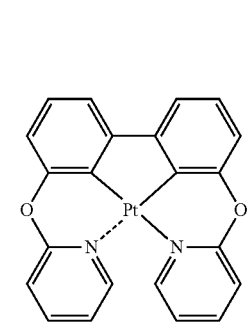
D33
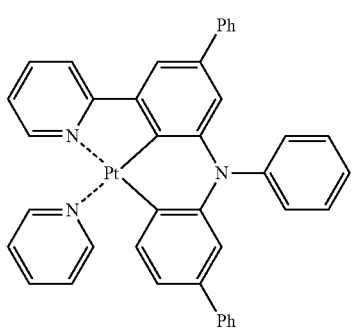
D34
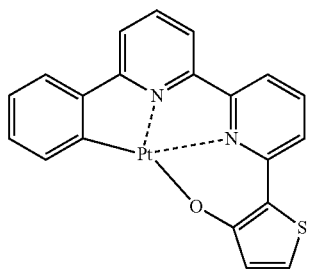
D35
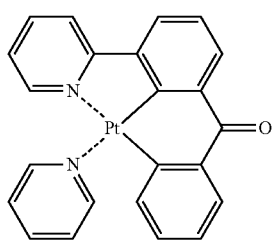
D36

-continued
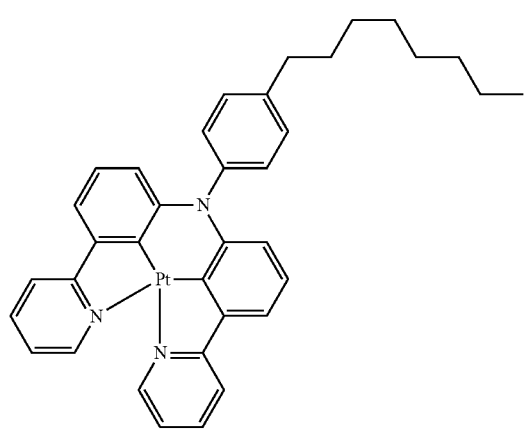
D37
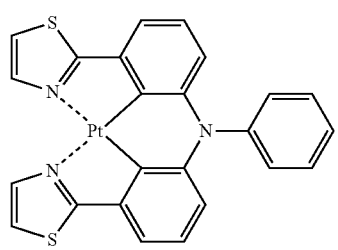
D38
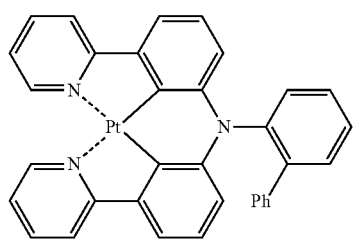
D39
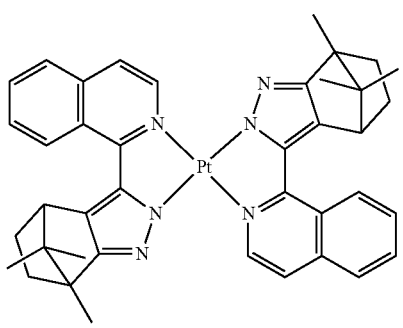
D40
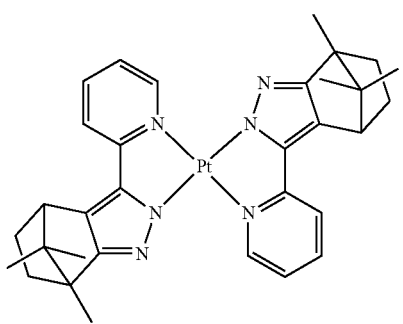
D41
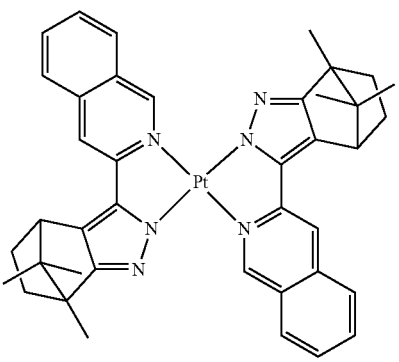
D42
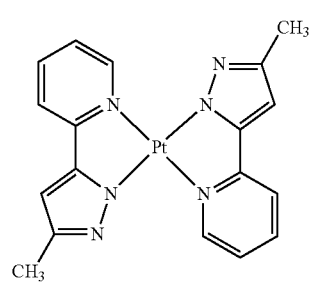
D43
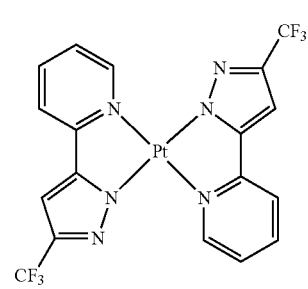
D44
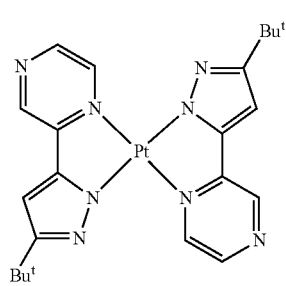
D45
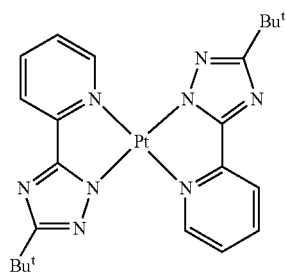
D46

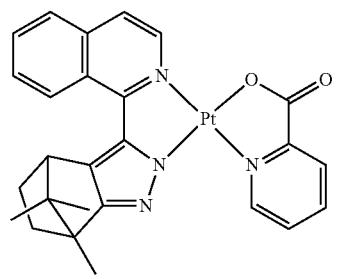

D47

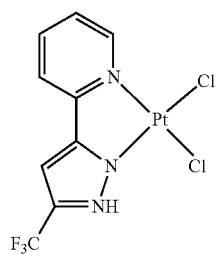

D48

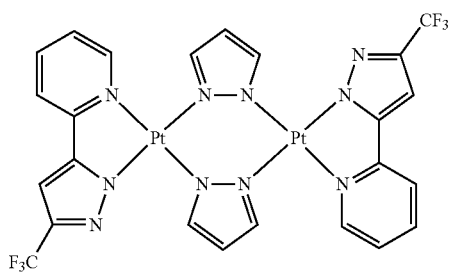

D49

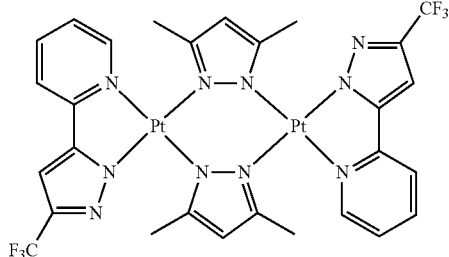

D50

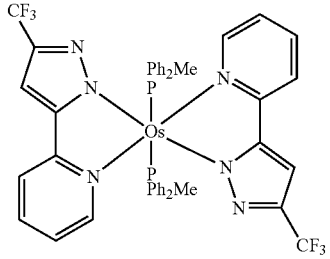

Os(fppz)₂(PPh₂Me)₂

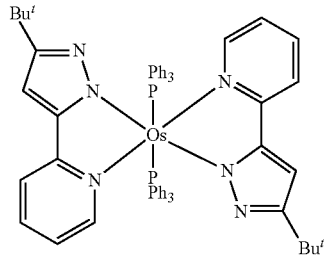

Os(bppz)₂(PPh₃)₂

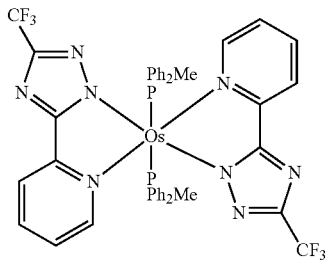

Os(fptz)₂(PPh₂Me)₂

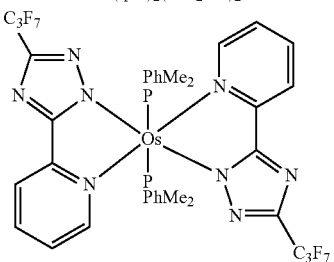

Os(hptz)₂(PPhMe₂)₂

In other implementations, a dopant used in the EML may be an Os-complex represented by the following formulae, as examples.

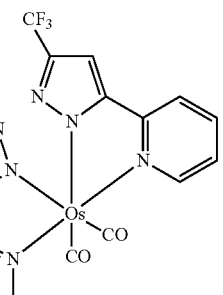

Os(fppz)₂(CO)₂

When the EML includes both a host and a dopant, an amount of the dopant may be in a range of, for example, about 0.01 to about 15 parts by weight based on 100 parts by weight of the host.

A thickness of the EML may be in a range of about 100 Å to about 1,000 Å, for example, about 200 Å to about 600 Å. When the thickness of the EML is within the range described above, the EML may have excellent light emitting ability without a substantial increase in driving voltage.

An ETL may be formed on the EML by using various methods, such as vacuum deposition, spin coating, or casting. When the ETL is formed using vacuum deposition or spin coating, the deposition and coating conditions may be similar to those for the formation of the HIL, although the deposition and coating conditions may vary according to the compound that is used to form the ETL. As a material for the ETL, a suitable material that stably transports electrons that are injected from an electron injection electrode (i.e., a cathode) may be used. Examples of s suitable material for the ETL include quinoline derivatives such as Alq₃, TAZ, BAlq, beryllium bis(benzoquinolin-10-olate (Bebq₂), ADN, Compound 201, and Compound 202 as shown below.

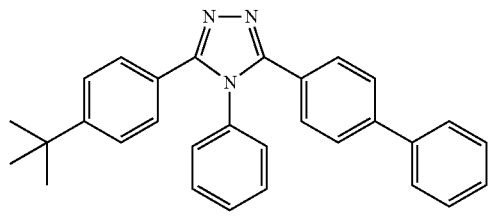

TAZ

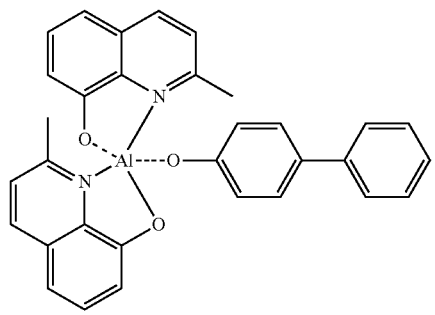

BAlq

<Compound 201>

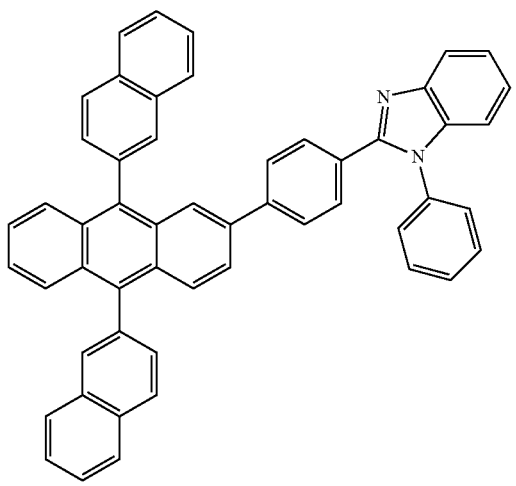

<Compound 202>

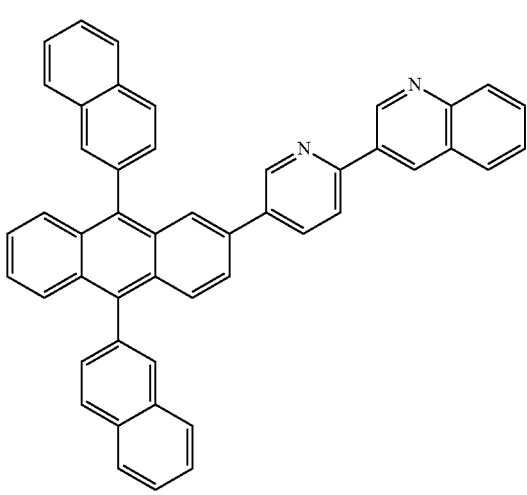

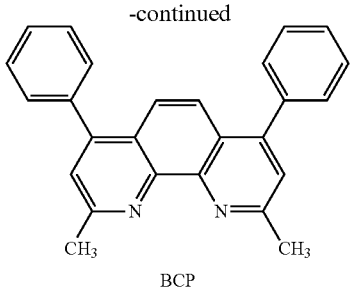

BCP

A thickness of the ETL may be in a range of about 100 Å to about 1,000 Å, for example, about 150 Å to about 500 Å. When the thickness of the ETL is within the above ranges, the ETL may have satisfactory electron transporting ability without a substantial increase in a driving voltage.

In some embodiments, the ETL may further include a metal-containing material, in addition to a known organic compound for the ETL.

The metal-containing material may include a lithium (Li) complex. Non-limiting examples of the Li complex are lithium quinolate (LiQ) and Compound 203 shown below.

<Compound 203>

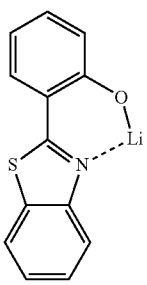

<LiQ>

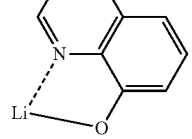

An EIL, which facilitates injection of electrons from the cathode, may be formed on the ETL. A suitable electron-injecting material may be used to form the EIL.

Examples of materials for the EIL include LiF, NaCl, CsF, Li₂O, or BaO. Deposition conditions of the EIL may be similar to those for the formation of the HIL, although the conditions may vary depending on the compound that is used to form the EIL.

A thickness of the EIL may be in a range of about 1 Å to about 100 Å, for example, about 3 Å to about 90 Å. When the thickness of the EIL is within the ranges described above, the EIL may have satisfactory electron transporting ability without a substantial increase in a driving voltage.

A second electrode 19 may be disposed on the organic layer 15. The second electrode 19 may be a cathode, which is an electron injecting electrode. A metal for forming the second electrode 19 may be a metal, an alloy, an electrically conductive compound, which all may have a low-work function, or a mixture thereof. As examples, the second electrode 19 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

Hereinbefore, the OLED 10 according to an embodiment has been described with reference to FIG. 1. In other implementations, the OLED may have other structures.

When the EML is formed using a phosphorescent dopant, a hole blocking layer (HBL) may be formed between the HTL and the EML or between the H-functional layer and the EML to prevent diffusion of triplet excitons or holes toward the ETL. the HBL may be formed by, for example, vacuum deposition, spin coating, casting, LB, or the like. When the HBL is formed using vacuum deposition or spin coating, the deposition and coating conditions may be similar to those for the formation of the HIL, although the conditions for deposition and coating may vary according to the material that is used to form the HBL. A suitable hole-blocking material may be used. Examples of hole-blocking materials include oxadiazole derivatives, triazole derivatives, or phenanthroline derivatives. For example, BCP illustrated below may be used as a material for the HBL.

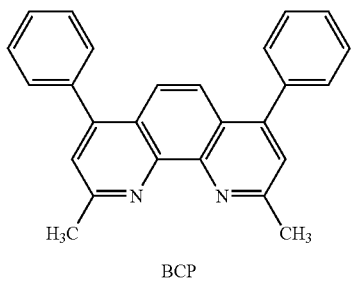 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 1,000 Å, for example, about 30 Å to about 300 Å. When the thickness of the HBL is within the above ranges, the HBL may have excellent hole blocking ability without a substantial increase in a driving voltage.

As used herein, the unsubstituted $C_1$-$C_{60}$ alkyl group may be a linear or branched $C_1$-$C_{60}$ alkyl group including a methyl group, an ethyl group, a propyl group, an isobutyl group, a sec-butyl group, a pentyl group, an iso-amyl group, and a hexyl group. The substituted $C_1$-$C_{60}$ alkyl group may be a $C_1$-$C_{60}$ alkyl group of which at least one hydrogen atom is substituted with at least one selected from a deuterium atom, a halogen atom, a hydroxyl group, a nitro group, a cyano group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_6$-$C_{60}$ aryl group, $C_2$-$C_{60}$ heteroaryl group, —N$(Q_{11})(Q_{12})$, and a —Si$(Q_{13})(Q_{14})(Q_{15})$, and B$(Q_{16})(Q_{17})$ (where $Q_{11}$ to $Q_{17}$ may be each independently a hydrogen atom, a $C_1$-$C_{60}$ alkyl group, a $C_2$-$C_{60}$ alkenyl group, a $C_2$-$C_{60}$ alkynyl group, a $C_5$-$C_{60}$ aryl group, and a $C_2$-$C_{60}$ heteroaryl group).

The substituted or unsubstituted $C_1$-$C_{60}$ alkoxy group may be a group represented by —OA (wherein A is the substituted or unsubstituted $C_1$-$C_{60}$ alkyl group described above). Examples of the unsubstituted $C_1$-$C_{60}$ alkoxy group include a methoxy group, an ethoxy group, or an isopropyloxy group. At least one hydrogen atom in these alkoxy groups may be substituted with one or more of the substituents described above in conjunction with the substituted $C_1$-$C_{60}$ alkyl group.

The substituted or unsubstituted $C_2$-$C_{60}$ alkenyl group may be the unsubstituted or substituted $C_2$-$C_{60}$ alkyl group having at least one carbon-carbon double bond at a center or at a terminal thereof. Examples of the unsubstituted $C_2$-$C_{60}$ alkenyl group include an ethenyl group, a propenyl group, a butenyl group, or the like. At least one hydrogen atom in these alkenyl groups may be substituted with those substituents described above in conjunction with the substituted $C_1$-$C_{60}$ alkyl group.

The substituted or unsubstituted $C_2$-$C_{60}$ alkynyl group may be a $C_2$-$C_{60}$ alkynyl group having at least one carbon-carbon triple bond at a center or at a terminal thereof. Examples of the unsubstituted $C_2$-$C_{60}$ alkynyl group include an ethynyl group, a propynyl group, and the like. At least one hydrogen atom in these alkynyl groups may be substituted with those substituents described above in conjunction with the substituted $C_1$-$C_{60}$ alkyl group.

The unsubstituted $C_6$-$C_{60}$ aryl group may be a monovalent carbocyclic aromatic system having 6 to 60 carbon atoms including at least one aromatic ring. The unsubstituted $C_6$-$C_{60}$ arylene group may be a divalent carbocyclic aromatic system having 6 to 60 carbon atoms including at least one aromatic ring. When the aryl group and the arylene group have at least two rings, they may be fused to each other. At least one hydrogen atom in the $C_6$-$C_{60}$ aryl group and the arylene group may be substituted with those substituents described above in conjunction with the $C_1$-$C_{60}$ alkyl group.

The unsubstituted $C_2$-$C_{60}$ heteroaryl group may be a monovalent carbocyclic aromatic system having at least one aromatic ring and at least one heteroatom selected from the group of N, O, P, and S. The unsubstituted $C_2$-$C_{60}$ heteroarylene group may be a divalent carbocyclic aromatic system having at least one aromatic ring and at least one heteroatom selected from N, O, P, and S. When the heteroaryl group and the heteroarylene group have at least two rings, they may be fused to each other. At least one hydrogen atom in the heteroaryl group and the heteroarylene group may be substituted with those substituents described with reference to the $C_1$-$C_{60}$ alkyl group.

Examples of the unsubstituted $C_2$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group and an imidazopyrimidinyl group. Examples of the substituted or unsubstituted $C_2$-$C_{60}$ heteroarylene group may be inferred based on those examples of the substituted or unsubstituted $C_2$-$C_{60}$ heteroaryl group described above.

The substituted or unsubstituted $C_6$-$C_{60}$ aryloxy group may be represented by —OA$_2$ (where A$_2$ is a substituted or unsubstituted $C_6$-$C_{60}$ aryl group described above). The substituted or unsubstituted $C_6$-$C_{60}$ arylthiol group may be represented by —SA$_3$ (where A$_3$ is a substituted or unsubstituted $C_6$-$C_{60}$ aryl group described above).

Hereinafter, the present invention will be described in detail with reference to the Synthesis Examples and other Examples below. However, these examples are for illustrative purposes only and are not intended to limit the scope.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis of Compound 1

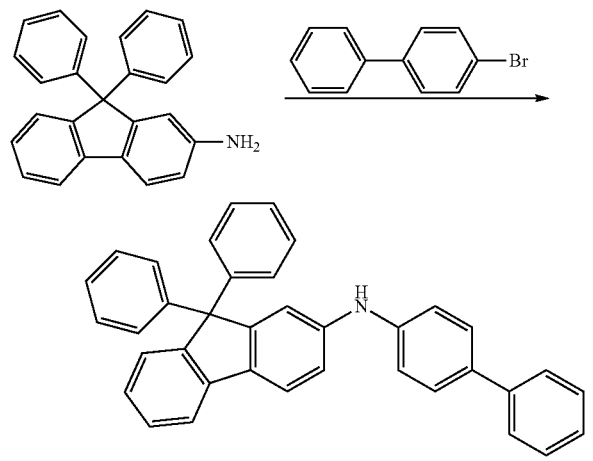

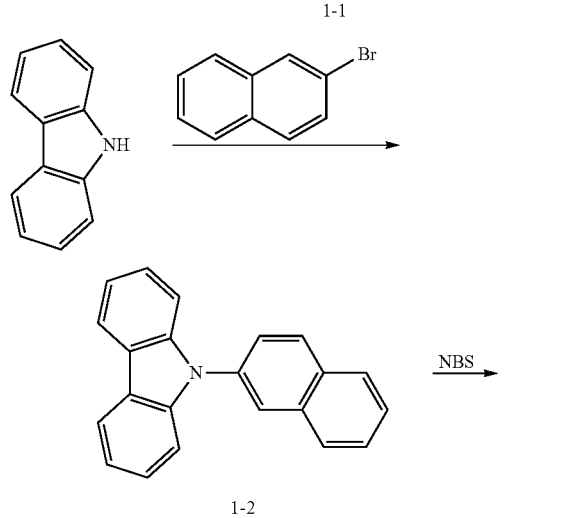

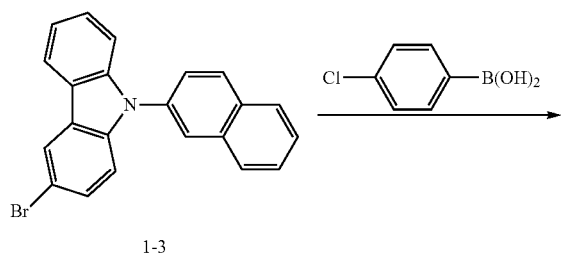

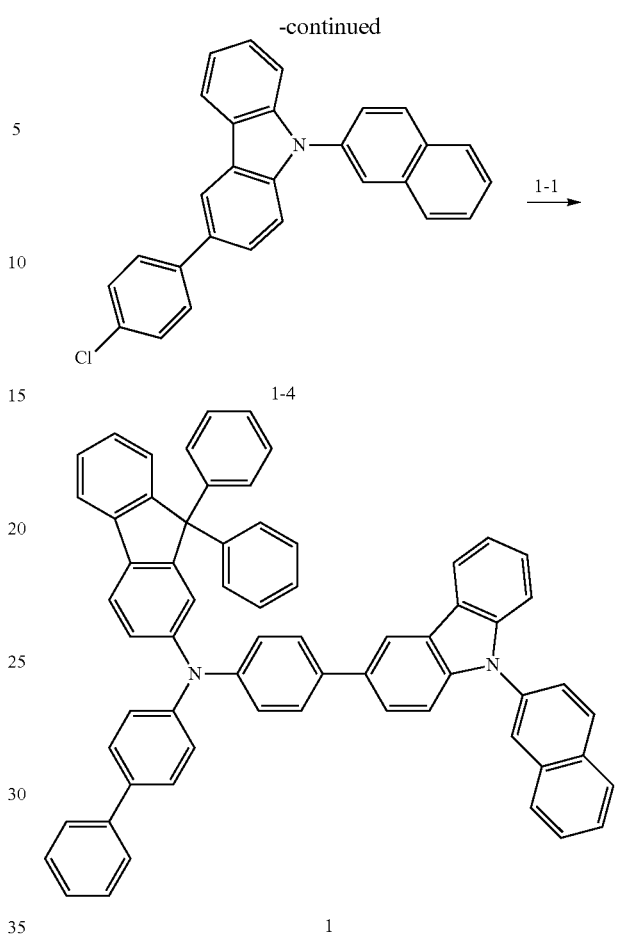

Synthesis of Intermediate I-1

After adding 57 g of 9,9-diphenyl-9H-fluorene-2-amine, 40 g of 4-bromobiphenyl, 0.4 g of tris(dibenzylideneaceton) dipalladium(0), 0.35 g of tri-(t-butyl)phosphine (50% toluene solution), 19.7 g of sodium t-butoxide, and 450 ml of toluene to a 1000 ml 4-necked round bottom flask under a nitrogen atmosphere, the mixture was slowly heated under reflux for 1 hour. The mixture was then cooled down to room temperature and diluted in 300 ml of acetone. After adding the resulting reaction mixture to methanol, solid crystals were precipitated, re-crystallized as acetone and ethyl acetate, and filtered and vacuum-dried to obtain 80 g of Intermediate 1-1.

$^1$H NMR (CDCl$_3$, 500 MHz, ppm): δ 7.67 (t, J=7.2 Hz, 2H), 7.55 (d, J=7.0 Hz, 2H), 7.46 (d, J=8.5 Hz, 2H), 7.41 (t, J=7.7 Hz, 2H), 7.36-7.27 (m, 3H), 7.23-7.18 (m, 11H), 7.16 (d, J=1.5 Hz, 1H), 7.11-7.09 (m, 1H), 7.05 (d, J=1.5 Hz, 2H), 5.84 (s, 1H).

Synthesis of Intermediate 1-2

After adding 100 g of carbazole, 130 g of 2-bromonaphthalene, 0.34 g of palladium acetate (II), 1.3 g of tri-(t-butyl)phosphine (50% toluene solution), 69 g of sodium t-butoxide, and 800 ml of o-xylene to a 2000 ml 4-necked ground bottom flask under a nitrogen atmosphere, the mixture was refluxed for 9 hours. The mixture was then cooled down to room temperature and diluted to a 200 ml of acetone. After adding the resulting reaction mixture to an excessive amount of methanol, solid crystals were precipitated, filtered, and vacuum-dried to obtain 108 g of Intermediate 1-2.

$^1$H NMR (CDCl$_3$, 500 MHz, ppm): δ 8.15 (d, J=7.5 Hz, 2H), 8.02 (d, J=8.5 Hz, 1H), 8.00 (d, J=1.5 Hz, 1H), 7.94-7.92 (m, 1H), 7.87-7.85 (m, 1H), 7.63 (dd, J=8.5, 2.0 Hz, 1H), 7.52-7.56 (m, 2H), 7.43 (d, J=8.5 Hz, 2H), 7.37-7.40 (m, 2H), 7.27-7.30 (m, 2H).

Synthesis of Intermediate 1-3

After adding 108 g of Intermediate 1-2 to a 5000 ml 4-necked ground bottom flask, the mixture was diluted in 2200 ml of chloroform, and 60 g of N-bromosuccinimide was slowly added thereto at room temperature. The mixture was then refluxed for 12 hours, and 2000 ml of distilled water were added thereto. The resulting reaction mixture was then stirred for 30 minutes to collect an organic layer. The collected organic layer was dried and concentrated, and solid crystals obtained therefrom were re-crystallized by acetone and ethyl acetate, filtered, and vacuum-dried to obtain 107 g of Intermediate 1-3.

$^1$H NMR (CDCl$_3$, 500 MHz, ppm): δ 8.26 (d, J=2.0 Hz, 1H), 8.10 (d, J=8.0 Hz, 1H), 8.04 (d, J=9.0 Hz, 1H), 7.99 (d, J=1.5 Hz, 1H), 7.97-7.95 (m, 1H), 7.90-7.78 (m, 1H), 7.61-7.56 (m, 3H), 7.48 (dd, J=8.5, 2.0 Hz, 1H), 7.42 (d, J=4.0 Hz, 2H), 7.32-7.24 (m, 2H).

Synthesis of Intermediate I-4

After adding 86 g of Intermediate 1-3 to a 3000 ml 4-necked ground bottom flask, the mixture was diluted to a 1700 ml of tetrahydrofuran. After adding 43 g of 4-chlorophenylboronic acid, 230 ml of 3M-potassium carbonate aqueous solution, and 10 g of tetrakis(triphenylphosphine) palladium (0) to the mixture, the resulting mixture was refluxed for 12 hours. The resulting reaction products were cooled down to room temperature, and tetrahydrofuran thereof was concentrated and diluted in acetone. After adding methanol to the resulting reaction products, solid crystals obtained therefrom were filtered and re-crystallized by acetone and methanol to obtain 83 g of Intermediate 1-4.

$^1$H NMR (CDCl$_3$, 500 MHz, ppm): δ 8.32 (d, J=1.5 Hz, 1H), 8.20 (d, J=7.5 Hz, 1H), 8.07 (d, J=8.5 Hz, 1H), 8.04 (d, J=2.0 Hz, 1H), 7.97-7.96 (m, 1H), 7.91-7.89 (m, 1H), 7.67-7.61 (m, 3H), 7.60-7.56 (m, 3H), 7.49-7.41 (m, 5H), 7.33-7.30 (m, 1H).

Manufacture of Compound 1

After adding 86 g of Intermediate 1-4, 114 g of Intermediate 1-1, 0.12 g of palladium acetate (II), 0.43 g of tri-(t-butyl)phosphine (50% toluene solution), 27 g of sodium t-butoxide, and 700 ml of o-xylene to a 2000 ml 4-necked ground bottom flask under a nitrogen atmosphere, the mixture was refluxed for 3 hours and cooled down to room temperature. After adding the resulting reaction mixture to an excessive amount of methanol, solid crystals were precipitated, filtered, and re-crystallized as dichloromethane and acetone to obtain 136 g of Compound 1.

$^1$H NMR (CDCl$_3$, 500 MHz, ppm): δ 8.34 (s, 1H), 8.21 (d, J=7.5 Hz, 1H), 8.07-8.05 (m, 2H), 7.97-7.95 (m, 1H), 7.91-7.89 (m, 1H), 7.69-7.66 (m, 2H), 7.63 (d, J=8.5 Hz, 2H), 7.59-7.56 (m, 7H), 7.50-7.40 (m, 8H), 7.36-7.28 (m, 6H), 7.24-7.18 (m, 13H).

Synthesis Example 2

Synthesis of Compound 2

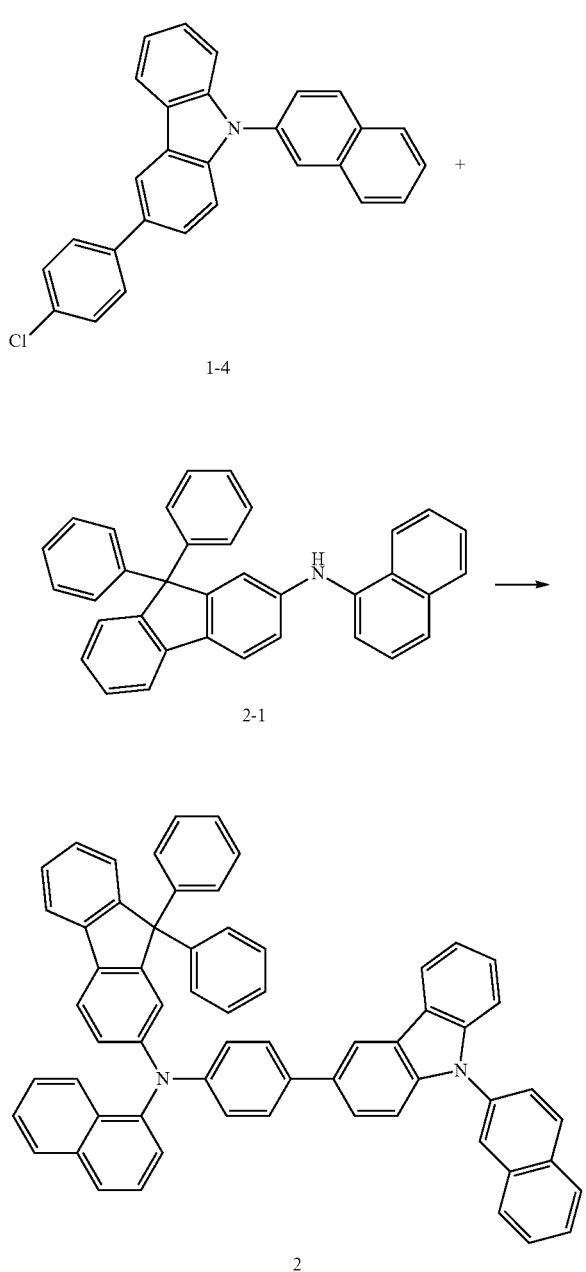

After adding 50 g of Intermediate 1-4, 68 g of Intermediate 2-1 of the Synthesis Example 1, 0.14 g of palladium acetate (II), 50 g of tri-(t-butyl)phosphine (50% toluene solution), 15 g of sodium t-butoxide, and 500 ml of o-xylene to a 2000 ml 4-necked ground bottom flask under a nitrogen atmosphere, the mixture was refluxed for 4 hours and cooled down to room temperature. After adding the resulting reaction mixture to an excessive amount of methanol, solid crystals were precipitated, filtered, and re-crystallized as dichloromethane and acetone to obtain 79 g of Compound 2.

$^1$H NMR (CDCl$_3$, 500 MHz, ppm): δ 8.29 (s, 1H), 8.17 (d, J=8.0 Hz, 1H), 8.04 (d, J=9.0 Hz, 2H), 7.95-7.86 (m, 4H), 7.75 (d, J=8.0 Hz, 1H), 7.65 (d, J=8.5 Hz, 1H), 7.62 (d, J=7.0 Hz, 1H), 7.58-7.52 (m, 4H), 7.48-7.39 (m, 7H), 7.35-7.22 (m, 6H), 7.17-7.09 (m, 11H), 7.04 (d, J=8.5 Hz, 2H), 6.97 (d, J=8.5 Hz, 1H)

Synthesis Example 3

Synthesis of Compound 3

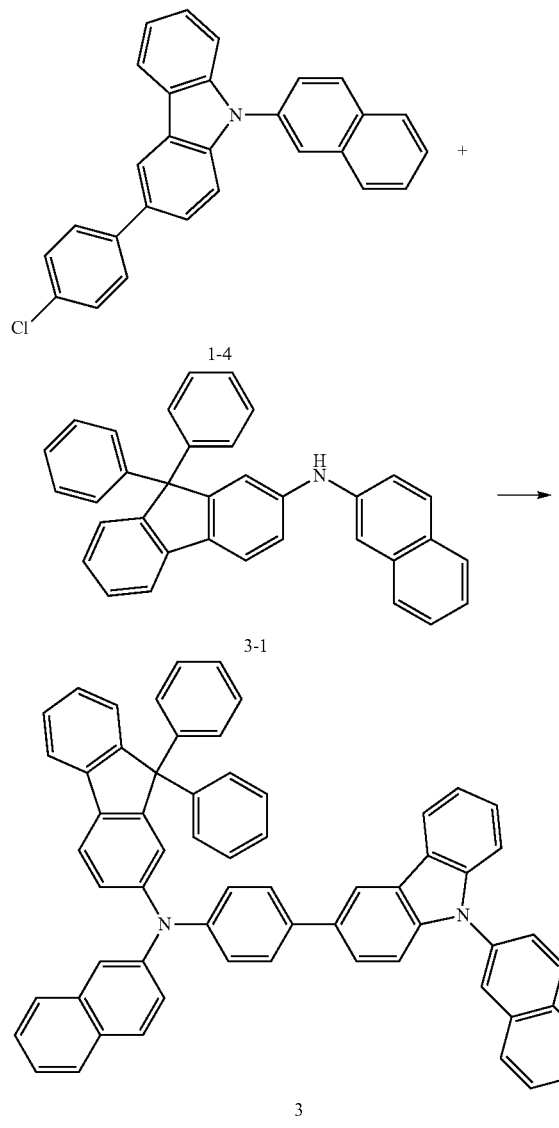

After adding 40 g of Intermediate 1-4, 54 g of Intermediate 3-1, 0.20 g of palladium acetate (II), 40 g of tri-(t-butyl)phosphine (50% toluene solution), 12 g of sodium t-butoxide, and 400 ml of o-xylene to a 2000 ml 4-necked ground bottom flask under a nitrogen atmosphere, the mixture was refluxed for 3 hours and cooled down to room temperature. After adding the resulting reaction mixture to an excessive amount of methanol that, solid crystals were precipitated, filtered, and re-crystallized as dichloromethane and acetone to obtain 61 g of Compound 3.

$^1$H NMR (CDCl$_3$, 500 MHz, ppm): δ 8.34 (s, 1H), 8.19 (d, J=8.0 Hz, 1H), 8.02 (d, J=8.5 Hz, 2H), 7.91 (m, 2H), 7.72 (d, J=7.5 Hz, 1H), 7.67-7.59 (m, 5H), 7.56-7.51 (m, 5H), 7.47-7.44 (m, 3H), 7.41-7.27 (m, 8H), 7.21-7.17 (m, 13H), 7.10 (d, J=8.0 Hz, 1H).

Synthesis Example 4

Synthesis of Compound 4

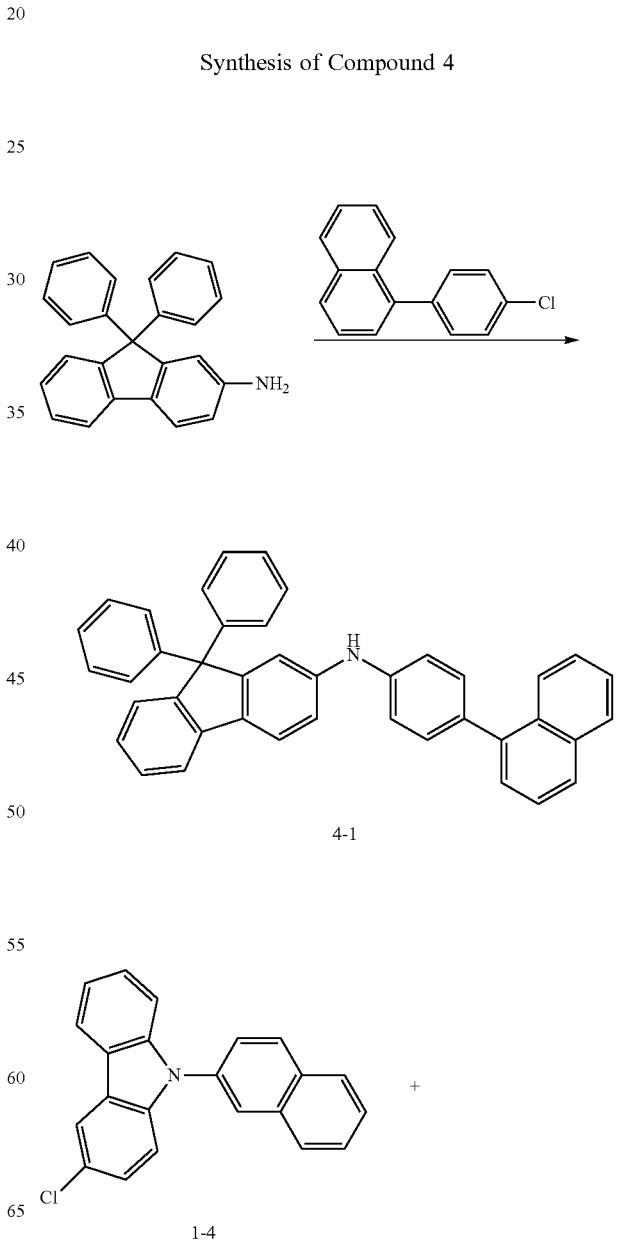

64

Synthesis Example 5

Synthesis of Compound 5

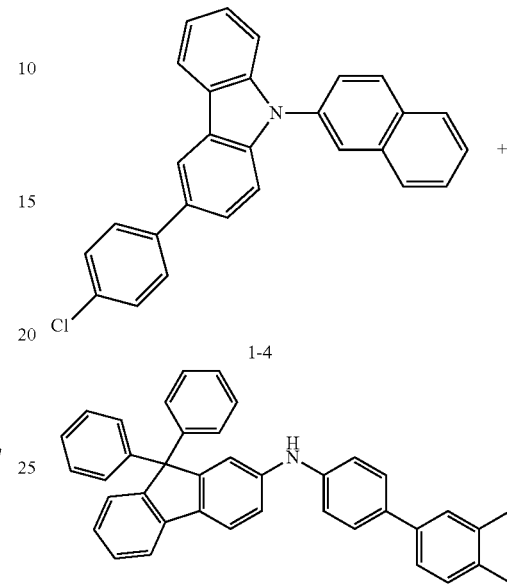

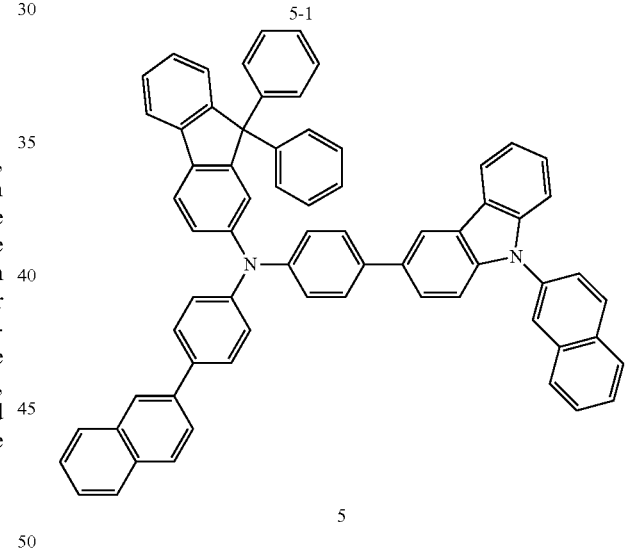

After adding 50 g of Intermediate 1-4 of Synthesis Example 1, 73 g of Intermediate 5-1, 0.14 g of palladium acetate (II), 0.25 g of tri-(t-butyl)phosphine (50% toluene solution), 15 g of sodium t-butoxide, and 500 ml of o-xylene to a 2000 ml 4-necked ground bottom flask under a nitrogen atmosphere, the mixture was refluxed for 2 hours and cooled down to room temperature. After adding the resulting reaction mixture to an excessive amount of methanol, solid crystals were precipitated, filtered, and re-crystallized as dichloromethane and acetone to obtain 105 g of Compound 5.

$^1$H NMR (CDCl$_3$, 500 MHz, ppm): δ 8.34 (s, 1H), 8.20 (d, J=8.0 Hz, 1H), 8.05-7.94 (m, 4H), 7.90-7.86 (m, 3H), 7.72 (d, J=8.0 Hz, 1H), 7.73-7.61 (m, 5H), 7.59-7.56 (m, 65-6H), 7.49-7.41 (m, 5H), 7.37-7.31 (m, 4H), 7.22-7.20 (m, 15H), 7.14 (dd, J=8.0, 2.0 Hz, 1H).

63

-continued

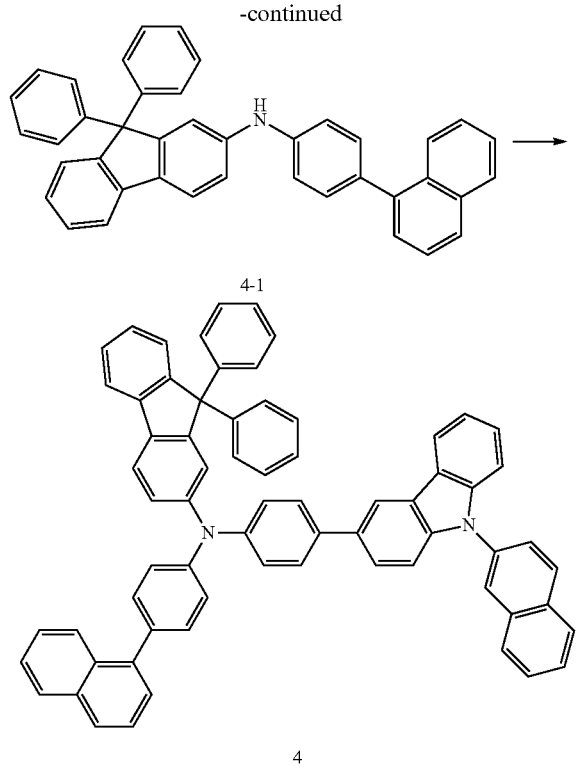

Synthesis of Intermediate 4-1

After adding 220 g of 9,9-diphenyl-9H-fluorene-2-amine, 149 g of 1-(4-chlorophenyl) naphthalene, 2.0 g of palladium acetate (II), 4.0 g of tri-(t-butyl)phosphine (50% toluene solution), 82 g of sodium t-butoxide, and 2000 ml of toluene to a 5000 ml 4-necked round bottom flask under a nitrogen atmosphere, the mixture was slowly heated under reflux for 2 hour. The mixture was then cooled down to room temperature and diluted to a 300 ml of acetone. After adding the resulting reaction mixture to an excessive amount methanol, solid crystals were precipitated, filtered, and re-crystallized as acetone and ethyl acetate to obtain 231 g of Intermediate 4-1.

Synthesis of Compound 4

After adding 42 g of Intermediate 1-4 of Synthesis Example 1, 61 g of Intermediate 4-1, 0.12 g of palladium acetate (II), 0.21 g of tri-(t-butyl)phosphine (50% toluene solution), 13 g of sodium t-butoxide, and 400 ml of o-xylene to a 2000 ml 4-necked ground bottom flask under a nitrogen atmosphere, the mixture was refluxed for 3 hours and cooled down to room temperature. After adding the resulting reaction mixture to an excessive amount of methanol, solid crystals were precipitated, filtered, and re-crystallized as ethyl acetate and acetone to obtain 81 g of Compound 4.

$^1$H NMR (CDCl$_3$, 500 MHz, ppm): δ 8.36 (s, 1H), 8.21 (d, J=7.5 Hz, 1H), 8.06 (d, J=8.5 Hz, 2H), 8.02 (d, J=8.5 Hz, 1H), 7.98-7.96 (m, 1H), 7.92-7.89 (m, 2H), 7.83 (d, J=8.0 Hz, 1H), 7.70-7.57 (m, 8H), 7.53-7.42 (m, 7H), 7.41-7.30 (m, 6H), 7.26 (d, J=8.5 Hz, 2H), 7.23-7.18 (m, 14H).

Example 1

An anode was prepared by cutting an ITO/Ag/ITO glass substrate having a thickness of 70/1000/70 Å into a size of 50 mm×50 mm×0.5 mm, followed by ultrasonic cleaning for about 5 minutes each using isopropyl alcohol and pure water. After that, the ITO/Ag/ITO glass substrate was subject to UV irradiation for about 30 minutes and exposure to ozone for cleaning, and then, the ITO/Ag/ITO glass substrate was loaded into a vacuum deposition device.

Next, Compound 1 was deposited on top of the ITO/Ag/ITO glass substrate to form an HTL having a thickness of 1,400 Å. Then, αβ-ADN (host) and Compound C (dopant) were co-deposited in a weight ratio of 200:3 to form an EML having a thickness of 200 Å.

Then, Compounds 201 and LiQ as electron transporting compounds were co-deposited on top of the EML in a weight ratio of 1:1 to form an ETL having a thickness of 360 Å, and LiQ was deposited on top of the ETL to form an EIL having a thickness of 5 Å. Mg and Ag were deposited on top of the EIL in a weight ratio of 130:10 to form a cathode having a thickness of 130 Å, to form an OLED.

<Compound C>

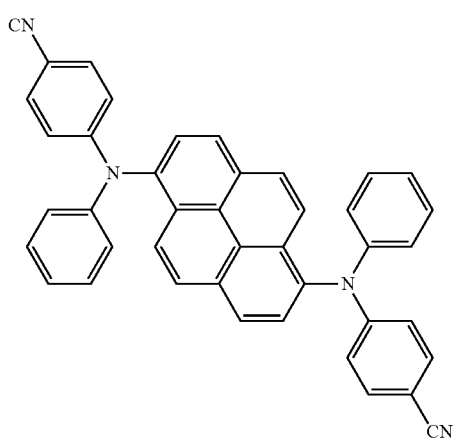

Example 2

An OLED was manufactured in the same manner as in Example 1, except that Compound 2, instead of Compound 1, was used to form the HTL.

Example 3

An OLED was manufactured in the same manner as in Example 1, except that Compound 3, instead of Compound 1, was used to form the HTL.

Example 4

An OLED was manufactured in the same manner as in Example 1, except that Compound 4, instead of Compound 1, was used to form the HTL.

Example 5

An OLED was manufactured in the same manner as in Example 1, except that Compound 5, instead of Compound 1, was used to form the HTL.

Comparative Example 1

An OLED was manufactured in the same manner as in Example 1, except that Compound A, instead of Compound 1, was used to form the HTL.

<Compound A>

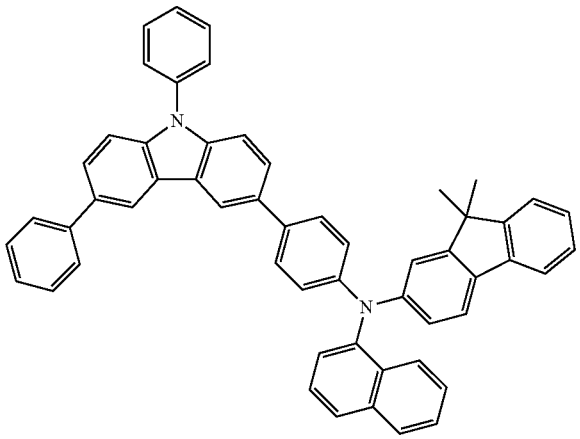

Comparative Example 2

An OLED was manufactured in the same manner as in Example 1, except that Compound B, instead of Compound 1, was used to form the HTL.

<Compound B>

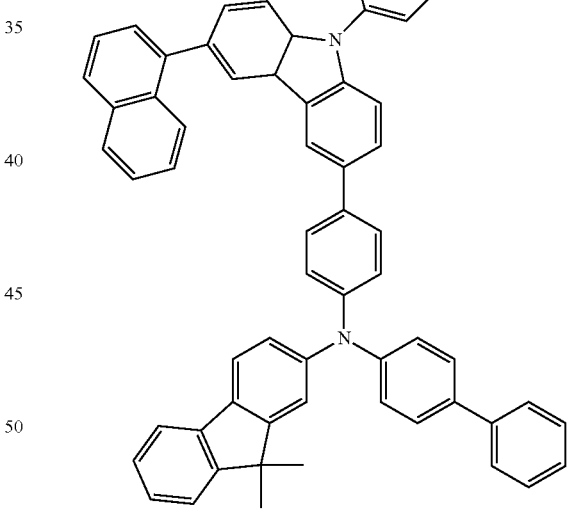

Evaluation Example 1

The driving voltage, current density, brightness, electric power, and color purity of each OLED from Examples 1 to 5 and Comparative Examples 1 and 2 were evaluated using Keithley SMU 236 and PR650 luminance meter. The results are show in Table 1 below. In this regard, lifespan data (at room temperature) may be inferred from FIG. 2 (a graph showing lifespan according to time-brightness (at 500 cd/m$^2$) of each OLED from Examples 1 to 5 and Comparative Examples 1 and 2). The brightness values of FIG. 2 are represented in percentage (%) compared to the initial brightness values.

TABLE 1

| | Hole transporting material | Driving voltage (V) | Current density (mA/cm²) | Brightness (cd/A) | Electric power (lm/W) | CIE_x | CIE_y |
|---|---|---|---|---|---|---|---|
| Example 1 | Compound 1 | 4.3 | 12.6 | 4.2 | 3.1 | 0.146 | 0.041 |
| Example 2 | Compound 2 | 4.0 | 13.7 | 5.2 | 4.1 | 0.139 | 0.054 |
| Example 3 | Compound 3 | 4.3 | 13.6 | 4.6 | 3.4 | 0.141 | 0.048 |
| Example 4 | Compound 4 | 4.3 | 13.7 | 4.3 | 3.1 | 0.144 | 0.044 |
| Example 5 | Compound 5 | 4.1 | 14 | 4.2 | 3.2 | 0.144 | 0.045 |
| Comparative Example 1 | Compound A | 3.9 | 13.8 | 3.5 | 2.8 | 0.148 | 0.040 |
| Comparative Example 2 | Compound B | 3.9 | 14.4 | 3.4 | 2.8 | 0.147 | 0.042 |

Figure 2:
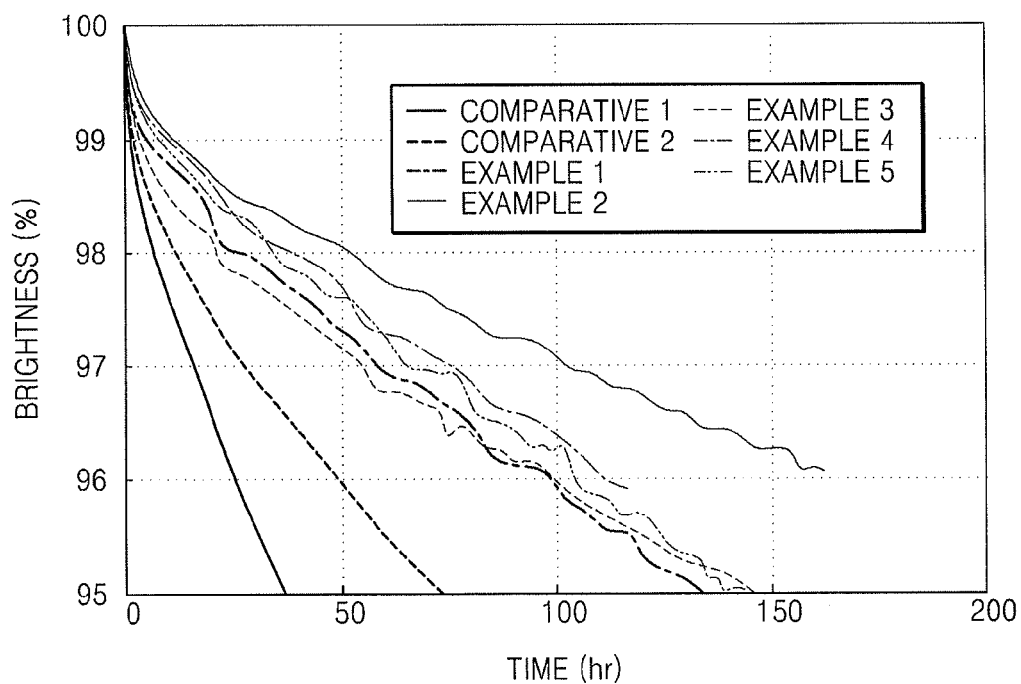
FIG. 2 illustrates a graph showing lifespan (at 500 cd/m$^2$) data of OLEDs prepared according to Examples 1 to 5 and Comparative Examples 1 and 2.

Referring to Table 1 and FIG. 2, the OLEDs from Examples 1 to 5 have excellent characteristics in terms of the driving voltage, current density, brightness, electric power, copor purity, and lifespan, compared to the OLEDs from Comparative Examples 1 and 2.

By way of summation and review, one or more embodiments include a material suitable for fluorescent and phosphorescent devices of all colors including red, green, blue, and white, wherein the material has excellent electrical stability, high charge-transport ability and light-emitting ability, high glass transition temperature, and the ability to prevent crystallization. One or more embodiments include an amine-based compound and an organic light-emitting diode (OLED) including the same. According to the one or more of the above embodiments, an organic light-emitting diode including the amine-based compound may have characteristics of low driving voltage, high efficiency, high color purity, and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An amine-based compound represented by Formula 1 below:

Formula 1

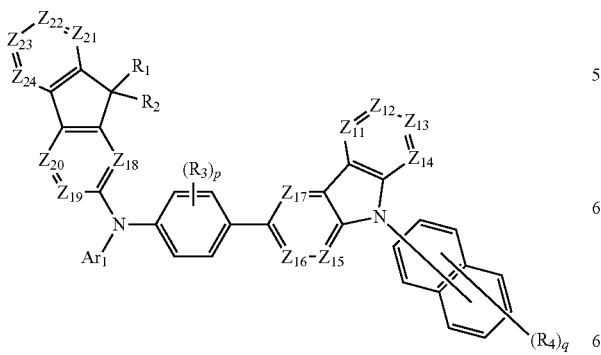

wherein, $Z_{11}$ is N or $C(R_{11})$, $Z_{12}$ is N or $C(R_{12})$, $Z_{13}$ is N or $C(R_{13})$, $Z_{14}$ is N or $C(R_{14})$, $Z_{15}$ is N or $C(R_{15})$, $Z_{16}$ is N or $C(R_{16})$, $Z_{17}$ is N or $C(R_{17})$, $Z_{18}$ is N or $C(R_{18})$, $Z_{19}$ is N or $C(R_{19})$, $Z_{20}$ is N or $C(R_{20})$, $Z_{21}$ is N or $C(R_{21})$, $Z_{22}$ is N or $C(R_{22})$, $Z_{23}$ is N or $C(R_{23})$, and $Z_{24}$ is N or $C(R_{24})$;

$Ar_1$ is selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, group, and a benzocarbazolyl group;

a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthracenyl group, a fluoranthenyl group, a pyrenyl group, a chrysenyl group, a naphthacenyl group, a picenyl group, a perylenyl group, a pentaphenyl group, a hexacenyl group, a pyrrolyl group, an imidazolyl group, a pyrazolyl group, a pyridinyl group, a pyrazinyl group, a pyrimidinyl group, a pyridazinyl group, an isoindolyl group, an indolyl group, an indazolyl group, a purinyl group, a quinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoxazolyl group, a benzoimidazolyl group, a furanyl group, a benzofuranyl group, a thiophenyl group, a benzothiophenyl group, a thiazolyl group, an isothiazolyl group, a benzothiazolyl group, an isoxazolyl group, an oxazolyl group, a triazolyl group, a tetrazolyl group, an oxadiazolyl group, a triazinyl group, and a benzocarbazolyl group, each substituted with at least one substituent selected from deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_6$-$C_{20}$ aryl group, and a $C_2$-$C_{20}$ heteroaryl group, a phenyl group substituted with two phenyl groups, a phenyl group substituted with a naphthyl group, a phenyl group substituted with a phenyl group and a naphthyl group, and a phenyl group substituted with two naphthyl groups;

$R_1$ and $R_2$ are each independently selected from:

a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group; and a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

$R_3$, $R_4$ and $R_{11}$ to $R_{24}$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group;

a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, and a $C_2$-$C_{60}$ heteroaryl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; and —N($Q_{11}$)($Q_{12}$), —Si($Q_{13}$)($Q_{14}$)($Q_{15}$), and —B($Q_{16}$)($Q_{17}$) (here, $Q_{11}$ and $Q_{17}$ are each independently a $C_1$-$C_{60}$ alkyl group, a $C_1$-$C_{60}$ alkoxy group, a $C_6$-$C_{60}$ aryl group, or a $C_2$-$C_{60}$ heteroaryl group);

p is an integer of 1 to 4; and q is an integer of 1 to 7.

2. The amine-based compound as claimed in claim 1, wherein $Z_{11}$ is C($R_{11}$), $Z_{12}$ is C($R_{12}$), $Z_{13}$ is C($R_{13}$), $Z_{14}$ is C($R_{14}$), $Z_{15}$ is C($R_{11}$), $Z_{16}$ is C($R_{16}$), $Z_{17}$ is C($R_{17}$), $Z_{18}$ is C($R_{18}$), $Z_{19}$ is C($R_{19}$), $Z_{20}$ is C($R_{20}$), $Z_{21}$ is C($R_{21}$), $Z_{22}$ is C($R_{22}$), $Z_{23}$ is C($R_{23}$), and $Z_{24}$ is C($R_{24}$).

3. The amine-based compound as claimed in claim 1, wherein $Ar_1$ of Formula 1 is selected from:

a phenyl group, a naphthyl group, a fluorenyl group, a spiro-fluorenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a naphthyl group, a fluorenyl group, a spiro-fluorenyl group, a phenalenyl group, an anthracenyl group, a fluoranthenyl group, a pyrenyl group, a chrysenyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, a triazinyl group, and a phenyl group substituted with two phenyl groups, a phenyl group substituted with a naphthyl group, a phenyl group substituted with a phenyl group and a naphthyl group, and a phenyl group substituted with two naphthyl groups.

4. The amine-based compound as claimed in claim 1, wherein Ar₁ of Formula 1 is represented by one of Formulae 3-1 and 3-4 to 3-20 below:

Formula 3-1

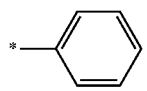

Formula 3-4

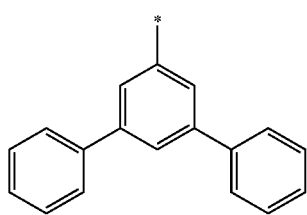

Formula 3-5

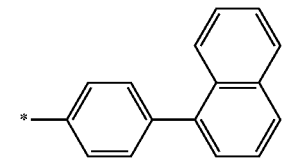

Formula 3-6

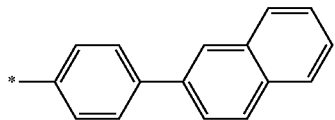

Formula 3-7

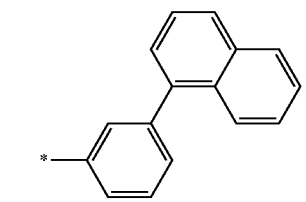

Formula 3-8

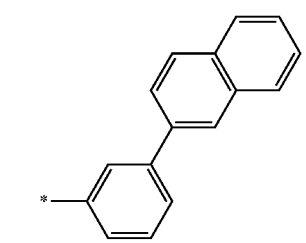

-continued

Formula 3-9

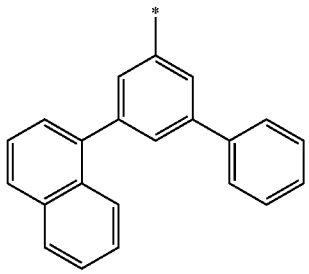

Formula 3-10

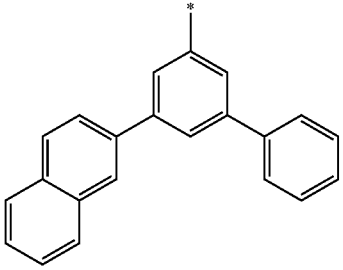

Formula 3-11

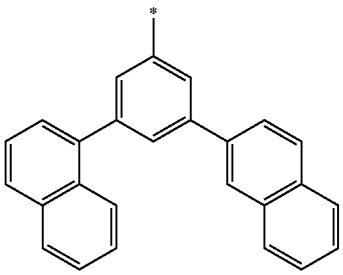

Formula 3-12

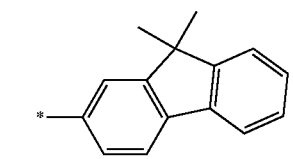

Formula 3-13

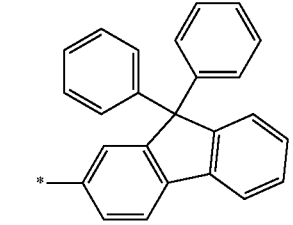

Formula 3-14

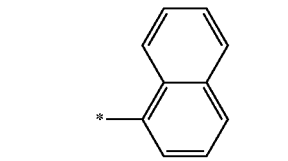

Formula 3-15

-continued

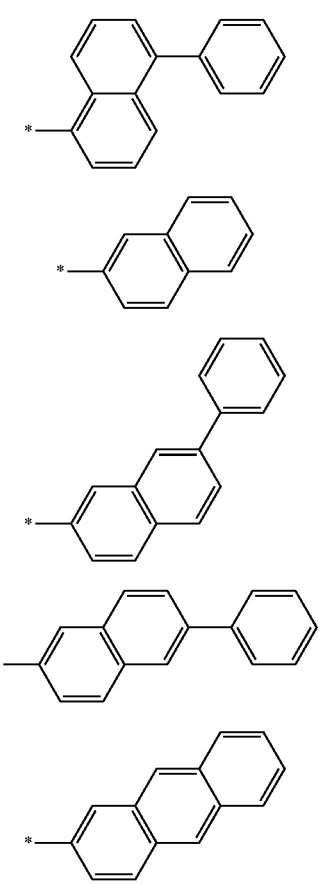

Formula 3-16

Formula 3-17

Formula 3-18

Formula 3-19

Formula 3-20 wherein, * in Formulae 3-1 to 3-20 indicates a binding site with a nitrogen atom (N) in Formula 1.

5. The amine-based compound as claimed in claim 1, wherein $R_1$ and $R_2$ are each independently selected from:
a $C_1$-$C_{20}$ alkyl group;
a $C_1$-$C_{20}$ alkyl group substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;
a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and
a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

6. The amine-based compound as claimed in claim 1, wherein $R_1$ and $R_2$ are each independently selected from:
a methyl group, an ethyl group, a propyl group, a butyl group, a pentyl group, a hexyl group, a heptyl group, and groups represented by Formula 3-1 to 3-20 below:

Formula 3-1

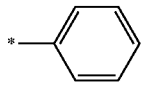

Formula 3-2

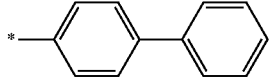

Formula 3-3

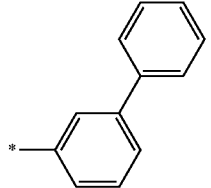

Formula 3-4

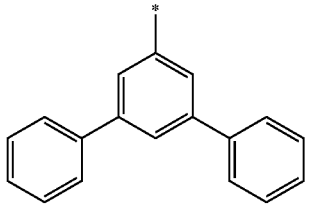

Formula 3-5

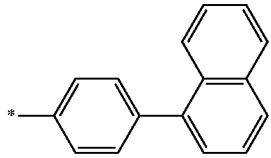

-continued

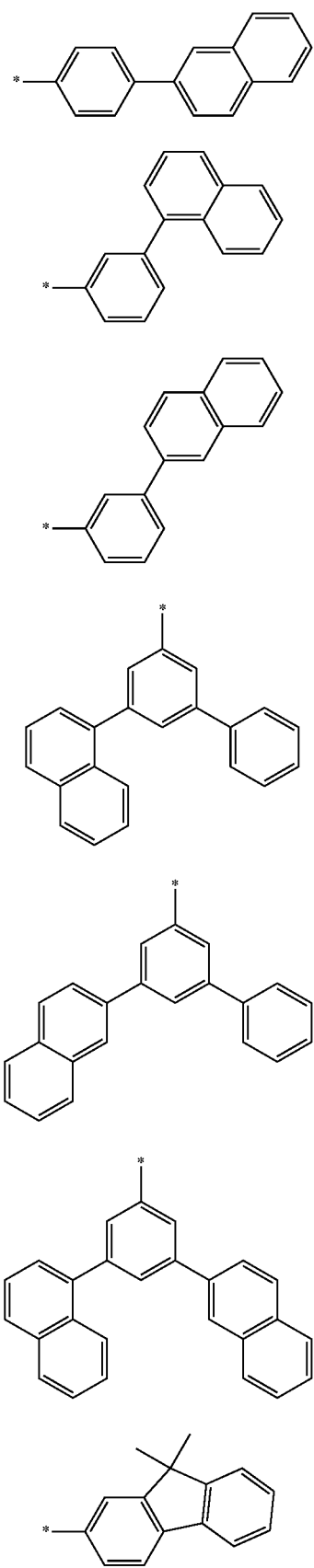

Formula 3-6

Formula 3-7

Formula 3-8

Formula 3-9

Formula 3-10

Formula 3-11

Formula 3-12

-continued

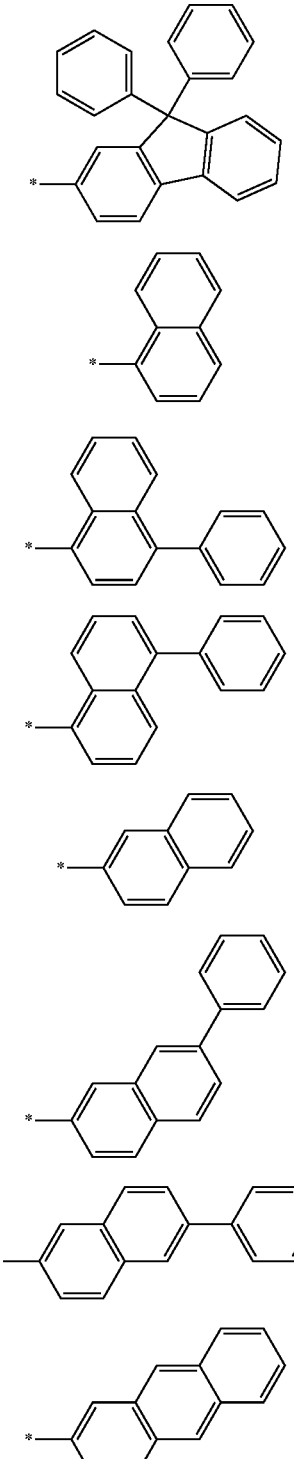

Formula 3-13

Formula 3-14

Formula 3-15

Formula 3-16

Formula 3-17

Formula 3-18

Formula 3-19

Formula 3-20 wherein, * in Formulae 3-1 to 3-20 indicates a binding site with a carbon atom of fluorene in Formula 1.

7. The amine-based compound as claimed in claim 1, wherein $R_3$, $R_4$ and $R_{11}$ to $R_{24}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{20}$ alkyl group;

a $C_1$-$C_{20}$ alkyl group each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; a phenyl group, a naphthyl group, a fluorenyl group, a spiro-fluorenyl group, a phenanthrenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

8. The amine-based compound as claimed in claim 1, wherein $R_3$, $R_4$ and $R_{11}$ to $R_{24}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{20}$ alkyl group.

9. The amine-based compound as claimed in claim 1, wherein $R_3$, $R_4$ and $R_{11}$ to $R_{24}$ are each independently selected from:

a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and compounds represented by Formulae 3-1 to 3-20 below:

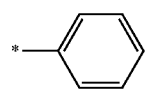

Formula 3-1

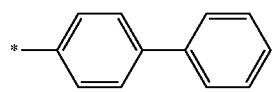

Formula 3-2

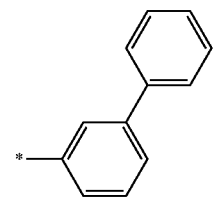

Formula 3-3

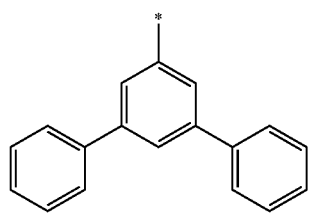

Formula 3-4

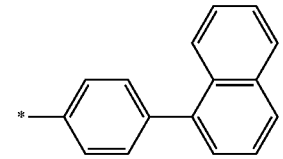

Formula 3-5

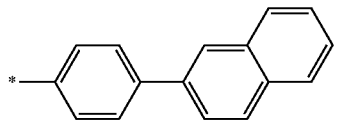

Formula 3-6

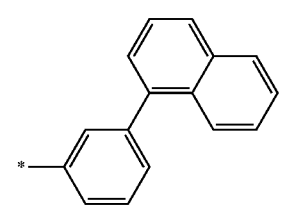

Formula 3-7

Formula 3-8
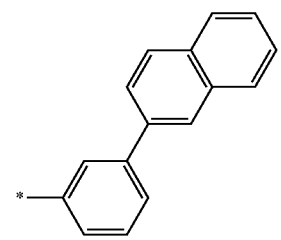
Formula 3-14
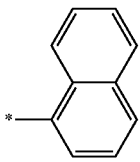
Formula 3-9
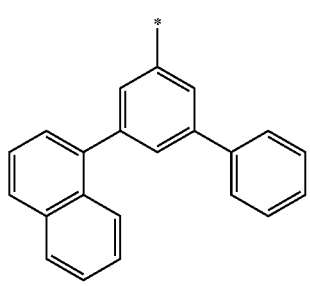
Formula 3-15
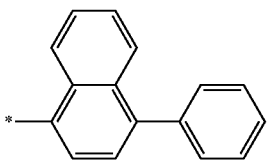
Formula 3-16
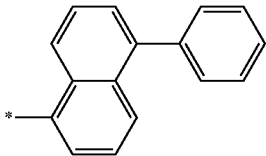
Formula 3-10
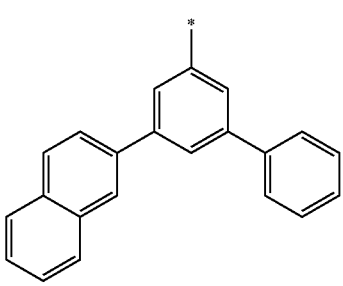
Formula 3-17
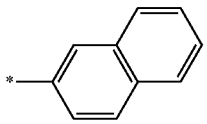
Formula 3-11
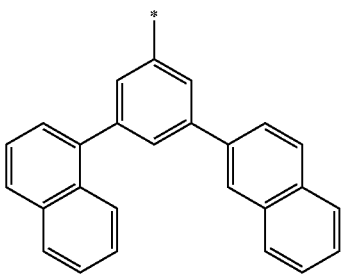
Formula 3-18
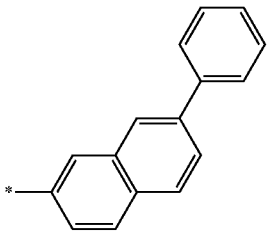
Formula 3-12
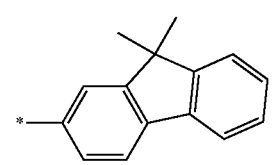
Formula 3-19
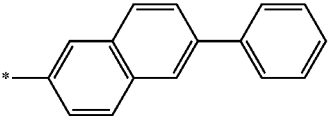
Formula 3-13
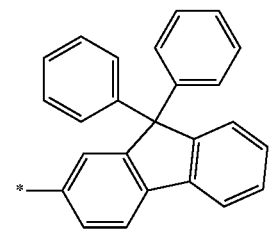
Formula 3-20
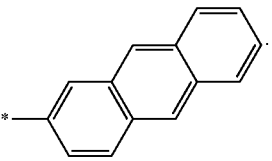
10. An amine-based compound represented by one of Formulae 1A and 1B below:

<Formula 1A>

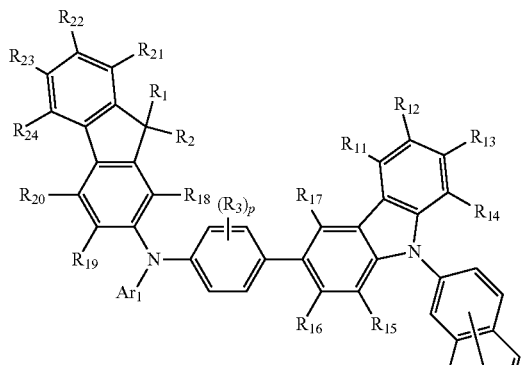

<Formula 1B>

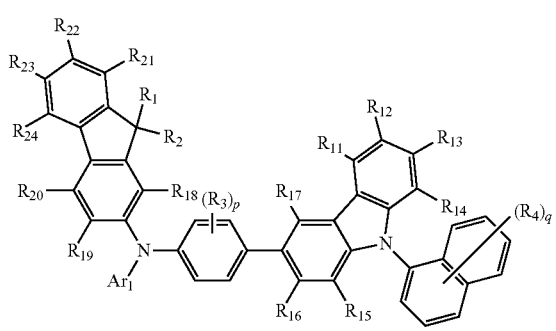

wherein, Ar₁ is selected from:
a phenyl group, a naphthyl group, a fluorenyl group, a spiro-fluorenyl group, a phenanthrenyl group, an anthracenyl group, a fluoranthenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and
a naphthyl group, a fluorenyl group, a spiro-fluorenyl group, a phenalenyl group, an anthracenyl group, a fluoranthenyl group, a pyrenyl group, a chrysenyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group,
a phenyl group substituted with two phenyl groups, a phenyl group substituted with a naphthyl group, a phenyl group substituted with a phenyl group and a naphthyl group, and a phenyl group substituted with two naphthyl groups;

$R_1$ and $R_2$ are each independently selected from:
a $C_1$-$C_{20}$ alkyl group;
a $C_1$-$C_{20}$ alkyl group each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and
a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group;

$R_3$, $R_4$ and $R_{11}$ to $R_{24}$ are each independently selected from:
a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{20}$ alkyl group;
a $C_1$-$C_{20}$ alkyl group substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group; and a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group, each substituted with at least one substituent selected from a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a phenalenyl group, an anthracenyl group, a fluoranthenyl group, a triphenylenyl group, a pyrenyl group, a chrysenyl group, a pyridinyl group, a pyrazinyl group, a pyrimidinyl group, a pyridazinyl group, an isoindolyl group, an indolyl group, a quinolinyl group, a benzoquinolinyl group, a quinoxalinyl group, a quinazolinyl group, a cinnolinyl group, a carbazolyl group, and a triazinyl group.

11. The amine-based compound as claimed in claim 10, wherein:

$Ar_1$ in Formulae 1A and 1B is selected from groups represented by Formulae 3-1 and 3-4 to 3-20 below:

$R_1$ and $R_2$ in Formulae 1A and 1B are each independently a methyl group, an ethyl group, a propyl group, a butyl group, a pentyl group, a hexyl group, a heptyl group, and groups represented by Formulae 3-1 to 3-20 below;

$R_3$, $R_4$ and $R_{11}$ to $R_{24}$ are each independently selected from a hydrogen atom, a deuterium atom, a halogen atom, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a methyl group, an ethyl group, a propyl group, a butyl group, a pentyl group, a hexyl group, a heptyl group, and groups represented by Formulae 3-1 to 3-20 below:

Formula 3-1
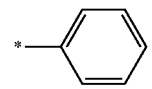

Formula 3-2
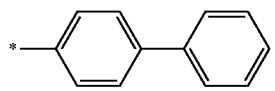

Formula 3-3
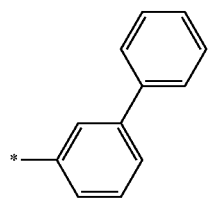

Formula 3-4
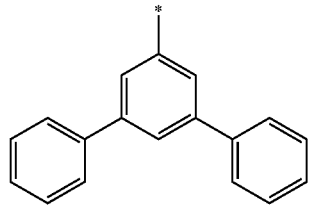

Formula 3-5
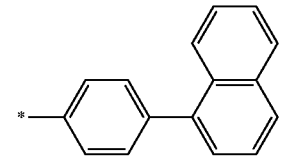

Formula 3-6
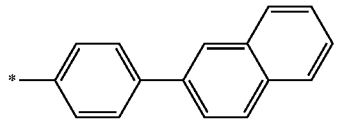

Formula 3-7
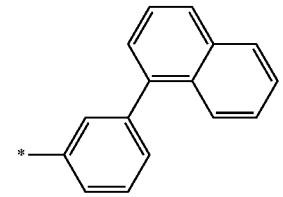

Formula 3-8
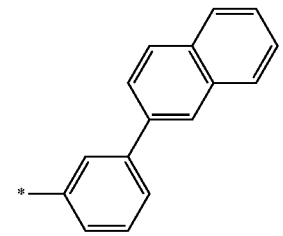

Formula 3-9
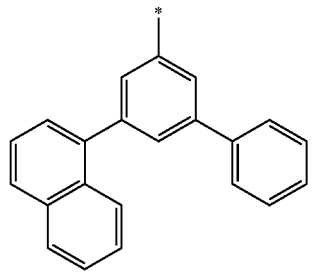

Formula 3-10
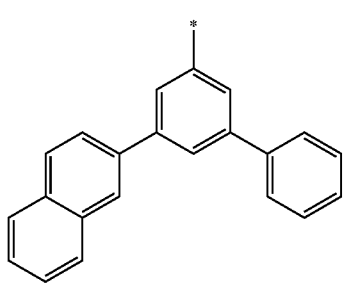

-continued
Formula 3-11
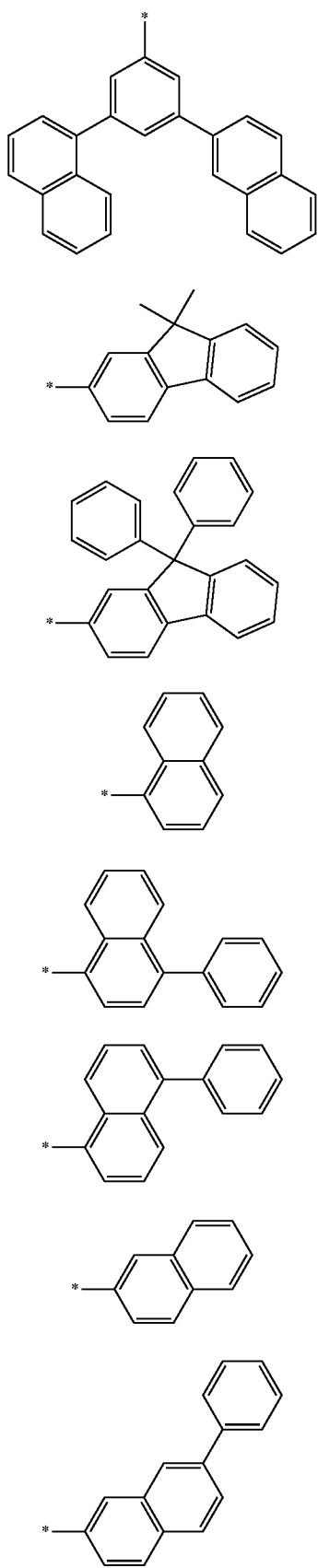
Formula 3-12
Formula 3-13
Formula 3-14
Formula 3-15
Formula 3-16
Formula 3-17
Formula 3-18
-continued
Formula 3-19
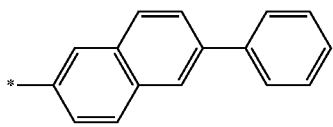
Formula 3-20
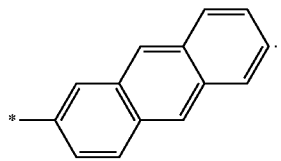
12. An amine-based compound being one of Compounds 2 to 5 below:
2
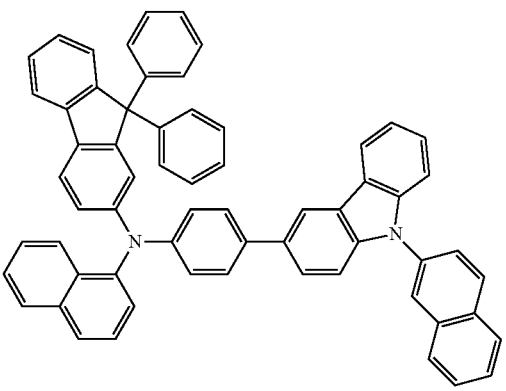
3
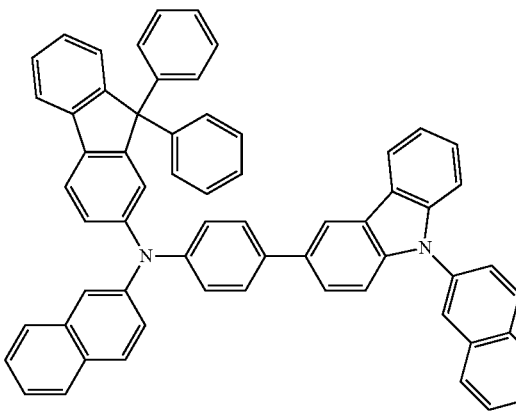
4
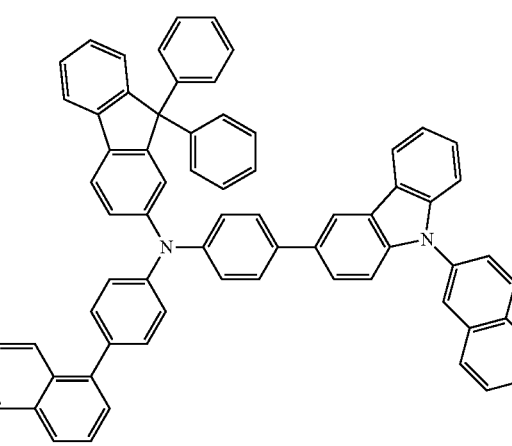

-continued

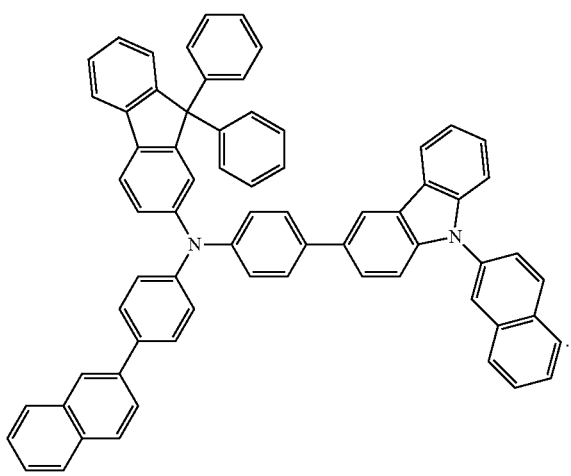

13. An organic light-emitting diode, comprising:
a first electrode;
a second electrode facing the first electrode;
and an organic layer between the first electrode and the second electrode, the organic layer including at least one of amine-based compound as claimed in claim 1.

14. The organic light-emitting device as claimed in claim 13, the organic layer including:
  i) a hole transport region that is between the first electrode and the EML and includes at least one layer selected from a hole injection layer, a hole transport layer, a functional layer having both hole injection and hole transport capabilities, a buffer layer, and an electron blocking layer; and
  ii) an electron transport region that is between the second electrode and the emission layer and includes at least one layer selected from a hole blocking layer, an electron transport layer, and an electron injection layer.

15. The organic light-emitting diode as claimed in claim 14, wherein the hole transport region includes the amine-based compound.

16. The organic light-emitting diode as claimed in claim 14, wherein the hole transport region further includes a p-dopant.

17. The organic light-emitting diode as claimed in claim 14, wherein:
  the hole transport region includes the hole transport layer, and
  the hole transport layer includes the amine-based compound.

* * * * *